United States Patent
Wachi et al.

(10) Patent No.: US 11,487,205 B2
(45) Date of Patent: Nov. 1, 2022

(54) SEMICONDUCTOR ELEMENT INTERMEDIATE, COMPOSITION FOR FORMING METAL-CONTAINING FILM, METHOD OF PRODUCING SEMICONDUCTOR ELEMENT INTERMEDIATE, AND METHOD OF PRODUCING SEMICONDUCTOR ELEMENT

(71) Applicant: MITSUI CHEMICALS, INC., Tokyo (JP)

(72) Inventors: Hiroko Wachi, Chiba (JP); Yasuhisa Kayaba, Urayasu (JP); Hirofumi Tanaka, Tsukuba (JP); Kenichi Fujii, Yokohama (JP)

(73) Assignee: MITSUI CHEMICALS, INC., Tokyo (JP)

( * ) Notice: Subject to any disclaimer, the term of this patent is extended or adjusted under 35 U.S.C. 154(b) by 281 days.

(21) Appl. No.: 16/757,830

(22) PCT Filed: Nov. 13, 2018

(86) PCT No.: PCT/JP2018/042035
§ 371 (c)(1),
(2) Date: Apr. 21, 2020

(87) PCT Pub. No.: WO2019/098208
PCT Pub. Date: May 23, 2019

(65) Prior Publication Data
US 2021/0191269 A1 Jun. 24, 2021

(30) Foreign Application Priority Data
Nov. 17, 2017 (JP) .............................. JP2017-221919
Mar. 27, 2018 (JP) .............................. JP2018-060575

(51) Int. Cl.
G03F 7/11 (2006.01)
H01L 21/311 (2006.01)
G03F 7/075 (2006.01)

(52) U.S. Cl.
CPC ............... *G03F 7/11* (2013.01); *G03F 7/075* (2013.01); *H01L 21/31144* (2013.01)

(58) Field of Classification Search
CPC . G03F 7/11; G03F 7/075; G03F 7/094; G03F 7/26; H01L 21/31144; H01L 21/0271; H01L 21/0332; H01L 21/3065
USPC .............. 430/5, 271.1, 272.1, 270.1
See application file for complete search history.

(56) References Cited

U.S. PATENT DOCUMENTS

| | | | |
|---|---|---|---|
| 4,368,099 A | 1/1983 | Huggett et al. | |
| 6,136,479 A | 10/2000 | Yamaguchi | |
| 8,927,201 B2 | 1/2015 | Takanashi et al. | |
| 2008/0227224 A1 | 9/2008 | Nambu | |
| 2014/0030660 A1* | 1/2014 | Takanashi | G03F 7/0002 106/287.18 |
| 2015/0118604 A1* | 4/2015 | Dynes | H01L 21/308 430/5 |
| 2018/0120706 A1 | 5/2018 | Shirakawa et al. | |
| 2018/0327547 A1 | 11/2018 | Kayaba et al. | |
| 2018/0334588 A1 | 11/2018 | Kayaba et al. | |

FOREIGN PATENT DOCUMENTS

| | | |
|---|---|---|
| JP | S58137835 A | 8/1983 |
| JP | H01501345 A | 5/1989 |
| JP | H03-104127 A | 5/1991 |
| JP | H04-027121 A | 1/1992 |
| JP | H05-109779 A | 4/1993 |
| JP | H08-130247 A | 5/1996 |
| JP | H11-295544 A | 10/1999 |
| JP | 2000-021978 A | 1/2000 |
| JP | 2005159264 A | 6/2005 |
| JP | 2008235332 A | 10/2008 |
| JP | 2009-164406 A | 7/2009 |
| JP | 2012-199361 A | 10/2012 |
| JP | 2013076973 A | 4/2013 |
| JP | 2014134581 A | 7/2014 |
| JP | 2016092051 A | 5/2016 |
| JP | 2018006742 A | 1/2018 |
| WO | 8803703 A1 | 5/1988 |
| WO | 2016/208300 A1 | 12/2016 |
| WO | 2017086361 A1 | 5/2017 |
| WO | 2017204090 A1 | 11/2017 |

OTHER PUBLICATIONS

International Search Report (PCT/ISA/210) dated Feb. 19, 2019, by the Japanese Patent Office as the International Searching Authority for International Application No. PCT/JP2018/042035.
Written Opinion (PCT/ISA/237) dated Feb. 19, 2019, by the Japanese Patent Office as the International Searching Authority for International Application No. PCT/JP2018/042035.

* cited by examiner

*Primary Examiner* — Caleen O Sullivan
(74) *Attorney, Agent, or Firm* — Buchanan, Ingersoll & Rooney PC

(57) ABSTRACT

Provided are a semiconductor element intermediate including: a substrate and a multilayer resist layer, in which the multilayer resist layer includes a metal-containing film, and in which the metal-containing film has a content of germanium element of 20 atm % or more, or a total content of tin element, indium element, and gallium element of 1 atm % or more, as measured by X-ray photoelectric spectroscopy, and an application of the semiconductor intermediate.

21 Claims, No Drawings

SEMICONDUCTOR ELEMENT INTERMEDIATE, COMPOSITION FOR FORMING METAL-CONTAINING FILM, METHOD OF PRODUCING SEMICONDUCTOR ELEMENT INTERMEDIATE, AND METHOD OF PRODUCING SEMICONDUCTOR ELEMENT

TECHNICAL FIELD

The present disclosure relates to a semiconductor element intermediate, a composition for forming a metal-containing film, a method of producing a semiconductor element intermediate, and a method of producing a semiconductor element.

BACKGROUND ART

One method of transferring a lithography pattern to a substrate using a hard mask is a multilayer resist process. In the multilayer resist process, a photoresist film (i.e., an upper layer resist film) and a lower layer resist film (for example, a silicon-containing lower layer resist film) having different etching selectivity from the upper layer resist film are used. In the multilayer resist process, a lower layer resist film is interposed between an upper layer resist film and a substrate to be processed, a pattern is formed on the upper layer resist film, the pattern is transferred to the lower layer resist film using the upper layer resist pattern as an etching mask, and the pattern is transferred to the substrate to be processed using the lower layer resist pattern as an etching mask.

For example, as a composition used for, for example, forming a lower layer resist film used in such a multilayer resist process, International Publication (WO) No. 2017/086361 describes a composition for forming a semiconductor film that includes a compound (A) including a Si—O bond and a cationic functional group containing at least one of a primary nitrogen atom or a secondary nitrogen atom; a crosslinking agent (B) including 3 or more —C(=O)OX groups (in which X represents a hydrogen atom or an alkyl group having from 1 to 6 carbon atoms) in the molecule, in which 1 to 6 out of the 3 or more —C(=O)OX groups are —C(=O)OH groups, and having a weight average molecular weight of from 200 to 600; and a polar solvent (D).

Japanese Patent Application Laid-Open (JP-A) No. 2014-134581 discloses composition for forming a metal oxide-containing film, characterized in that the composition includes, as a component (A), a metal oxide-containing compound $A_1$ obtained by hydrolyzing and/or condensing one or more hydrolyzable metal compounds represented by the following Formula (A-1):

$$L(OR^{0A})_{a0}(OR^{1A})_{a1}(O)_{a2} \quad \text{(A-1)}$$

(wherein $R^{0A}$ and $R^{1A}$ each represents an organic group having from 1 to 30 carbon atoms; a0, a1, and a2 each represents an integer of 0 or more, and a0+a1+2×a2 represents a valence determined by the type of L; and L represents aluminum, gallium, yttrium, titanium, zirconium, hafnium, bismuth, tin, vanadium, or tantalum), and, as a component (B), an aromatic compound having a specific structure that generates a hydroxyl group by heat and/or acid.

SUMMARY OF INVENTION

Technical Problem

When a semiconductor element is produced by the multilayer resist process or the like as described above, a semiconductor element intermediate including a resist film or the like is used.

In the disclosure, a semiconductor element intermediate refers to a material that is used for producing a semiconductor element, and in which at least one film selected from films that are used for producing a semiconductor element, such as a resist film or an embedded insulating film, is formed on a substrate.

When producing a semiconductor element by the multilayer resist process or the like, multiple exposure is performed by repeating plural exposures in order to perform fine processing with exposure below the resolution limits of a light source wavelength, a lens, a mask, an apparatus thereof, and correction software thereof. In the multiple exposure, a second and subsequent exposures need to be superposed on a previously exposed portion, and more precise alignment accuracy is demanded.

In this regard, in advanced micro processing that exceeds the limit of exposure alignment accuracy using a semiconductor element intermediate, a method has been proposed in which, in a film (such as an SOG (spin-on-glass) film, an SOC (spin-on-carbon) film, an a-Si (amorphous silicon) film, an $SiO_2$ (silicon oxide) film, or an $SiN_x$ (silicon nitride) film) that constitutes a part of a multilayer resist layer, a metal-containing film with etching resistance different from such a film is embedded in a recess (for example, a hole) formed therein, thereby correcting processing-alignment in a self-aligning manner.

In the multilayer resist process, for example, when transferring a upper layer resist pattern to a lower layer resist film, and when transferring a lower layer resist pattern to a substrate to be processed, dry etching such as plasma etching is widely used.

In plasma etching, a $Cl_2$-based gas represented by $Cl_2$ or the like is used for etching a metal or a metal compound such as Al, Ti, TiN, or Si, an organic substance, or the above-described SOC film or a-Si film, for example.

In plasma etching, a fluorocarbon-based gas represented by $CF_4$ or the like is used for etching an $SiO_2$ film, an $SiN_x$ film, or the like, for example.

As described above, in order to correct processing-alignment in a self-aligning manner, a metal-containing film embedded in a recess is required to have, for example, the properties (switching characteristics) of being less likely to be removed by $Cl_2$ gas (i.e., low etching rate, or that is to say, high etching resistance) and being more likely to be removed by $CF_4$ gas (i.e., high etching rate, or that is to say, low etching resistance) than an SOC film or an a-Si film.

Other examples of the switching characteristics include the properties of being less likely to be removed by $CF_4$ gas (low etching rate, or that is to say, high etching resistance) and being more likely to be removed by $Cl_2$/Ar gas (high etching rate, or that is to say, low etching resistance) than an $SiO_2$ film or an $SiN_x$ film.

Furthermore, a film constituting a part of a multilayer resist layer (such as an SOC film, an a-Si film, an $SiO_2$ film, or an $SiN_x$ film) can be efficiently processed by using a metal-containing film having excellent switching characteristics.

Specifically, for example, JP-A No. 2014-134581 describes a processing method for processing a body to be processed such as an $SiO_2$ film by forming a carbon hard mask film on a body to be processed by chemical vapor deposition (CVD) and sequentially forming thereon a metal-containing film and a photoresist film containing an organic material and the like.

In such a processing method, for example, the following steps (A1) to (A5) are performed.

(A1) A photoresist film is exposed and developed, an SOC film is removed with a gas containing oxygen, and then a metal-containing film is etched with $CF_4$ gas or the like;

(A2) the photoresist film and the SOC film are removed and a carbon hard mask film is etched with an $O_2$-based gas or the like;

(A3) a body to be processed such as an $SiO_2$ film is etched with $CF_4$ gas or the like;

(A4) the metal-containing film is removed by wet cleaning using ammonia, water, and the like; and (A5) the carbon hard mask film, remaining as a lower layer of the metal-containing film removed in (A4), is removed with an $O_2$-based gas or the like.

However, when using a metal-containing film having excellent switching characteristics, it is possible to perform a processing method for processing a body to be processed in which a metal-containing film and a photoresist film containing an organic material and the like are sequentially formed on a body to be processed such as an $SiO_2$ film.

In other words, the use of a metal-containing film with excellent switching characteristics has an advantage that there is no need to form a carbon hard mask film as described above.

As a processing method in the case of using a metal-containing film having excellent switching characteristics, specifically, for example, the following steps (B1) to (B4) are performed.

In the following steps (B1) to (B4), metal species to be contained in a metal-containing film that is used and gas used for etching can be appropriately changed in consideration of switching characteristics. The switching characteristics between the metal species contained in the metal-containing film and a body to be processed that is used will be described below.

(B1) A photoresist film is exposed and developed, and then a metal-containing film is etched with a $Cl_2$/Ar-based gas or the like;

(B2) the photoresist film is removed with an $O_2$-based gas or the like;

(B3) a body to be processed such as an $SiO_2$ film is etched with $CF_4$ gas or the like; and (B4) the remaining metal-containing film is removed with a $Cl_2$/Ar-based gas or the like.

In this manner, according to the processing method using the metal-containing film having excellent switching characteristics, the metal-containing film can be removed by gas etching as shown in step (B4).

In other words, as compared with the processing method using a carbon hard mask film as described above, the processing method using the metal-containing film having excellent switching characteristics has an advantage that there is no need to perform wet cleaning.

Such a method also has an advantage that pattern deformation, pattern collapse, and the like due to wet cleaning can be suppressed.

It is noted that the above-described requirements for the switching characteristics are also required for a film other than resist films (for example, an embedded insulating film, such as a Shallow Trench Isolation film (STI film), a Pre Metal Dielectric film (PMD film), or an inter-wiring layer insulating film (such as an IMD film or an ILD film)) from the viewpoint of realizing formation of a fine pattern.

An aspect of the invention according to the present disclosure provides a semiconductor element intermediate including a metal-containing film having excellent switching characteristics, a method of producing a semiconductor element intermediate, and a method of producing a semiconductor element using a metal-containing film having excellent switching characteristics.

Another aspect of the invention according to the present disclosure provides a composition for forming a metal-containing film that is used for producing the semiconductor element intermediate.

Solution to Problem

Means for solving the above-described problems include the following aspects.

<1> A semiconductor element intermediate including: a substrate and a multilayer resist layer, wherein the multilayer resist layer includes a metal-containing film, and the metal-containing film has a content of germanium element of 20 atm % or more, or a total content of tin element, indium, element and gallium element of 1 atm % or more, as measured by X-ray photoelectric spectroscopy.

<2> The semiconductor element intermediate according to <1>, wherein the metal-containing film is solid at 400° C. under an atmosphere of 1 atm.

<3> The semiconductor element intermediate according to <1> or <2>, wherein the metal-containing film has a content of germanium element of 30 atm % or more, or a total content of tin element, indium element, and gallium element of from 2 atm % to 30 atm %.

<4> The semiconductor element intermediate according to any one of <1> to <3>, wherein the metal-containing film includes a germanium oxide, or includes at least one selected from a tin oxide, an indium oxide, or a gallium oxide.

<5> The semiconductor element intermediate according to any one of <1> to <4>, wherein a recess is formed in at least one layer of the multilayer resist layer, and the metal-containing film is formed inside the recess and is in contact with a bottom of the recess.

<6> The semiconductor element intermediate according to any one of <1> to <5>, wherein the metal-containing film is at least one layer included in the multilayer resist layer.

<7> The semiconductor element intermediate according to any one of <1> to <6>, wherein the multilayer resist layer includes at least one of a spin-on carbon film or an amorphous silicon film, and the metal-containing film has a content of germanium element of 20 atm % or more as measured by X-ray photoelectric spectroscopy.

<8> The semiconductor element intermediate according to any one of <1> to <6>, wherein the multilayer resist layer includes at least one of a silicon dioxide film or a silicon nitride film, and the metal-containing film has a total content of tin element, indium element, and gallium element of 1 atm % or more, as measured by X-ray photoelectric spectroscopy.

<9> The semiconductor element intermediate according to any one of <1> to <7>, wherein the metal-containing film is a resist film.

<10> The semiconductor element intermediate according to any one of <1> to <7>, wherein the metal-containing film is an embedded insulating film.

<11> The semiconductor element intermediate according to <10>, wherein a recess is formed in at least one layer of the multilayer resist layer, the metal-containing film is formed inside the recess, and the recess has a width of from 5 nm to 300 nm.

<12> A composition for forming the metal-containing film in the semiconductor element intermediate according to any one of <1> to <11>, wherein the composition has a content of germanium element of 20 atm % or more, or a total content of tin element, indium element, and gallium element of 1 atm % or more, as measured by X-ray photoelectric spectroscopy after firing at 400° C. for 10 minutes under a nitrogen atmosphere.

<13> The composition for forming a metal-containing film according to <12>, wherein the composition has a refractive index of from 1.3 to 2.0 after firing at 400° C. for 10 minutes under a nitrogen atmosphere.

<14> The composition for forming a metal-containing film according to <12> or <13>, wherein the metal-containing film has a content of germanium element of 30 atm % or more, or a total content of tin element, indium element, and gallium element of from 2 atm % to 30 atm %.

<15> The composition for forming a metal-containing film according to any one of <12> to <14>, wherein the composition has an onset temperature for curing of 300° C. or lower.

<16> The composition for forming a metal-containing film according to any one of <12> to <15>, wherein the composition includes at least one selected from the group consisting of a germanium alkoxide compound, a germanium carbide compound, a germanium hydroxide, and a germanium halide, or includes at least one selected from the group consisting of a tin alkoxide compound, a tin carbide compound, a tin hydroxide, a tin halide, an indium alkoxide compound, an indium carbide compound, an indium hydroxide, an indium halide, a gallium alkoxide compound, a gallium carbide compound, a gallium hydroxide, and a gallium halide.

<17> The composition for forming a metal-containing film according to any one of <12> to <16>, wherein the composition includes a solvent.

<18> A method of producing the semiconductor element intermediate according to any one of <1> to <11>, wherein the method includes steps of:

preparing a member for forming a metal-containing film; and forming a metal-containing film on the member for forming a metal-containing film by a sputtering method.

<19> A method of producing the semiconductor element intermediate according to any one of <1> to <11>, wherein the method includes steps of:

preparing a member for forming a metal-containing film;

applying the composition for forming a metal-containing film according to any one of <12> to <17>, onto the member for forming a metal-containing film; and a step of firing the applied composition for forming a metal-containing film.

<20> A method of producing a semiconductor element, including steps of:

preparing the semiconductor element intermediate according to any one of <1> to <11>; and etching the semiconductor element intermediate.

<21> A method of producing a semiconductor device, including steps of:

preparing a member including a resist layer including an upper layer and a lower layer and exposing and etching the upper layer;

etching the lower layer;

forming a metal-containing film in a recess formed on the lower layer;

exposing and etching the upper layer again; and etching the lower layer again, wherein the metal-containing film has a content of germanium element of 20 atm % or more, or a total content of tin element, indium element, and gallium element of 1 atm % or more, as measured by X-ray photoelectric spectroscopy.

<22> A method of producing a semiconductor element, including steps of:

forming a resist layer A on a substrate;

forming a metal-containing film on the resist layer A;

further forming a resist layer B different from the resist layer A on the metal-containing film;

exposing and developing the resist layer B;

etching the metal-containing film;

etching the resist layer A; and removing the metal-containing film with an etching gas, wherein the metal-containing film has a content of germanium element of 20 atm % or more, or a total content of tin element, indium element, and gallium element of 1 atm % or more, as measured by X-ray photoelectric spectroscopy.

Advantageous Effects of Invention

According to an aspect of the invention according to the present disclosure, there can be provided a semiconductor element intermediate including a metal-containing film having excellent switching characteristics, a method of producing the semiconductor element intermediate, and a method of producing a semiconductor element using the metal-containing film having excellent switching characteristics.

According to another aspect of the invention according to the present disclosure, there can be provided a composition for forming a metal-containing film that is used for producing the semiconductor element intermediate.

DESCRIPTION OF EMBODIMENTS

Hereinafter, embodiments of the disclosure will be described.

In the disclosure, and after "to", as the minimum value and the maximum value, respectively.

In the disclosure, the amount of a component of a composition, when plural substances corresponding to the same component exist in the composition, the total amount of the component in the composition refers to a total amount of the plural substances in the composition, unless otherwise specified.

In the disclosure, the term "step" includes not only a separate step but also a step that is not clearly distinguished from other steps as long as an intended purpose of the step is achieved therefrom.

In the notation of a group (atomic group) in the disclosure, the notation without an indication of substitution and unsubstitution encompasses those having no substituent and those having a substituent group. For example, the term "alkyl group" encompasses not only an alkyl group having no substituent group (unsubstituted alkyl group) but also an alkyl group further having a substituent group (substituted alkyl group).

The chemical structural formula in the disclosure may be described as a simplified structural formula in which a hydrogen atom is omitted.

In the disclosure, the weight average molecular weight refers to a weight average molecular weight in terms of polyethylene glycol measured by GPC (Gel Permeation Chromatography) method.

Specifically, the weight average molecular weight is calculated by an analysis software (480II Data Station, manufactured by System Instruments Co., Ltd) using an aqueous solution having a sodium nitrate concentration of 0.1 mol/L as a developing solvent, detecting the refractive index at a flow rate of 1.0 ml/min using an analytical device Shodex GPC-101, two types of analytical columns (TSKgel G6000PWXL-CP and TSKgel G3000PWXL-CP, manufactured by Tosoh Corporation), and a reference column (TSKgel SCX, manufactured by Tosoh Corporation), and using polyethylene glycol as a standard product.

In the disclosure, "% by mass" and "% by weight" have the same meaning, and "part by mass" and "part by weight" have the same meaning.

In the disclosure, a combination of two or more preferred aspects is a more preferable.

In the disclosure, the term "resist" refers to a protective film against a physical or chemical treatment. Usually, a resist is removed from an object to be processed once protection of the object to be processed becomes unnecessary.

(Semiconductor Element Intermediate)

The semiconductor element intermediate according to the disclosure includes a substrate and a multilayer resist layer, in which the multilayer resist layer includes a metal-containing film, and metal-containing film has a content of germanium element of 20 atm % or more, or a total content of tin element, indium element, and gallium element of 1 atm % or more, as measured by X-ray photoelectric spectroscopy.

The present inventors have found that, when a semiconductor element intermediate is produced by forming a resist film or an embedded insulating film using the film composition for forming a semiconductor described in WO 2017/086361 or JP-A No. 2014-134581 to produce, the resist film or embedded insulating film formed does not have switching characteristics.

Under such circumstances, the inventors extensively studied to find that, in a semiconductor element intermediate having a substrate and a multilayer resist layer, in which the multilayer resist layer includes a metal-containing film, the metal-containing film is less likely to be removed by $Cl_2$ gas and more likely to be removed by $CF_4$ gas as compared with an SOC film or an a-Si film, or that is to say, has excellent in switching characteristics, in a case in which the metal-containing film has a content of germanium element of 20 atm % or more for example.

The inventors have also found that, in the semiconductor element intermediate having the above-described configuration, the metal-containing film is less likely to be removed by $CF_4$ gas and more likely to be removed by $Cl_2$/Ar gas as compared with an $SiO_2$ film or an $SiN_x$ film, or that is, to say has excellent switching characteristics, in a case in which the metal-containing film has a total content of tin element, indium element, and gallium element of 1 atm % or more for example.

<Metal-Containing Film>

The metal-containing film according to the disclosure is a film included in a multilayer resist layer. This metal-containing film has a content of germanium element of 20 atm % or more, or a total content of tin element, indium element, and gallium element of 1 atm % or more. Here, each of the content of germanium element, the content of tin element, the content of indium element, and the content of gallium element is measured by X-ray photoelectric spectroscopy.

Examples of the metal-containing film include: at least one layer of the multilayer resist layer, a film embedded in a recess formed in at least one layer of the multilayer resist layer, and an embedded insulating film (such as a Shallow Trench Isolation film (STI film), a pre-metal dielectric film (PMD film), or an inter-wiring layer insulating film (such as an 1 MB film or an ILD film)).

In other words, the metal-containing film is preferably a resist film.

When the metal-containing film is at least one layer of the multilayer resist layer, the metal-containing film is preferably an upper or intermediate layer of the multilayer resist layer.

In the disclosure, an upper layer refers to a resist film located farthest from a substrate among resist films included in the multilayer resist layer, a lower layer refers to a resist film located closest to a substrate among resist films included in the multilayer resist layer, and an intermediate layer refers to a resist film located between an upper layer and a lower layer among resist films included in the multilayer resist layer.

When the lower layer is a film having insulation properties such as an $SiO_2$ film or an $SiN_x$ film, a part of the lower layer may be left as an insulating film.

Examples of specific aspects of the multilayer resist layer include: an aspect in which an SOC film or an a-Si film is used as a lower layer, and a metal-containing film having a content of germanium element of 20 atm % or more is used as an intermediate layer or an upper layer; and an aspect in which an $SiO_2$ film or an $SiN_x$ film is used as an upper layer, an intermediate layer, or a lower layer, or in which a metal-containing film having a total content of tin element, indium element, and gallium element of 1 atm % or more is used as an upper layer, an intermediate layer, or a lower layer.

The metal-containing film also preferably has the following aspect.

Specifically, an aspect in which a recess is formed in at least one layer of the multilayer resist layer, and the metal-containing film is formed inside the formed recess and is in contact with a bottom of the recess is also preferable.

According to such an aspect, it is possible to form a film embedded in a recess formed in at least one layer of the multilayer resist layer as described above, an embedded insulating film, an inter-wiring layer insulating film, and the like.

The metal-containing film is preferably an embedded insulating film.

Here, details of the multilayer resist layer and the embedded insulating film to which the metal-containing film is applied will be described below.

As described above, "the metal-containing film is in contact with a bottom of the recess" means that the metal-containing film is not necessary in contact with an entire bottom of the recess as long as it is in contact with at least a part of a bottom of the recess.

Examples of the metal-containing film other than the above include a metal-containing film (for example, an embedded planarizing film) in which a recess formed in a substrate is filled with a gap fill material.

In a case in which the metal-containing film is used as the at least one layer of the multilayer resist layer, the metal-containing film is removed in the production of a semiconductor element from the semiconductor element intermediate.

The embedded insulating film is a film remaining on a semiconductor element when the semiconductor element is produced from the semiconductor element intermediate. Therefore, when the metal-containing film is used as the embedded insulating film, a semiconductor element eventually obtained from the semiconductor element intermediate is a semiconductor element having the metal-containing film.

[Composition]

The metal-containing film is not particularly limited, and from the viewpoint of improving the switching characteristics, the metal-containing film has a content of germanium element of preferably 24 atm % or more, and more preferably 30 atm % or more, as measured by X-ray photoelectric spectroscopy.

The upper limit of the content is not particularly limited, and may be 100% or less.

The metal-containing film is not particularly limited, and from the viewpoint of improving the switching characteristics, the metal-containing film has a total content of tin element, indium element, and gallium element of preferably from 2 atm % to 30 atm %, and more preferably from 5 atm % to 22 atm %, as measured by X-ray photoelectric spectroscopy.

The metal-containing film according to the disclosure preferably includes a germanium oxide, or includes one or more selected from a tin oxide, an indium oxide, or a gallium oxide.

—Measurement Method by X-Ray Electron Spectroscopy—

The content of each of the germanium element, the tin element, the indium element, and the gallium element is measured as a presence ratio of a detected element except a hydrogen atom.

Specifically, the content of each of the above described elements is measured using AXIS-NOVA (manufactured by Kratos Analytical Limited) as an apparatus, monochromatic AlKα (1486.6 eV) as an X-ray source, and 700 μm×300 μm as an analysis region.

—Composition of Other Elements—

Other elements measured by X-ray electron spectroscopy in the metal-containing film according to the disclosure are not particularly limited, and examples thereof include metal elements other than a carbon atom, an oxygen atom, a nitrogen atom, a silicon atom, germanium element, tin element, indium element, and gallium element (for example, aluminum element, titanium element, and zirconium element), and the content ratio thereof is not particularly limited. From the viewpoint of obtaining more favorable switching characteristics, in a case in which the metal-containing film contains 20 atm % or more of germanium element, the content of a metal element other than germanium element is preferably 20 atm % or less, more preferably 10 atm % or less, still more preferably 5 atm % or less, and particularly preferably 1 atm % or less.

In a case in which the total content of tin element, indium element, and gallium element in the metal-containing film is 1 atm % or more, the content of a metal element other than tin element, indium element, and gallium element is preferably 20 atm % or less, more preferably 10 atm % or less, still more preferably 5 atm % or less, and particularly preferably 1 atm % or less.

[Etching Rate]

The metal-containing film according to the disclosure is defined to have switching characteristics in a case in which one of a relative etching rate of the metal-containing film to other film to be etched with respect to one gas used for etching (i.e., etching rate of the metal-containing film according to the disclosure/etching rate of another film to be etched) and a relative etching rate of the metal-containing film to other film to be etched with respect to another gas used for etching exceeds 1, and the other is 1 or less.

For example, the metal-containing film according to the disclosure has switching characteristics in a case in which one of a relative etching rate of the metal-containing film to an SOC film (or a-Si film) with respect to $Cl_2$ gas and a relative etching rate of the metal-containing film to an SOC film (or a-Si film) with respect to $CF_4$ gas exceeds 1, and the other is 1 or less.

In a case in which the metal-containing film according to the disclosure contains 20 atm % or more of germanium element, the relative etching rate of the metal-containing film to an SOC film (or a-Si film) with respect to $Cl_2$ gas (i.e., etching rate of metal-containing film in the present disclosure/etching rate of SOC film (or a-Si film)) is preferably 0.8 or less, more preferably 0.5 or less, and still more preferably 0.2 or less. Similarly, in a case in which the metal-containing film contains 20 atm % or more of germanium element, the relative etching rate of the metal-containing film to an SOC film (or a-Si film) with respect to $CF_4$ gas is preferably 1.2 or more, more preferably 1.5 or more, and still more preferably 1.8 or more.

In a case in which the metal-containing film contains 20 atm % or more of germanium element, it is preferable that the relative etching rate of the metal-containing film to an SOC film (or a-Si film) with respect to $Cl_2$ gas is 0.8 or less, and the relative etching rate of the metal-containing film to an SOC film (or a-Si film) with respect to $CF_4$ gas is 1.2 or more; it is more preferable that the relative etching rate of the metal-containing film to an SOC film (or a-Si film) with respect to $Cl_2$ gas is 0.5 or less, and the relative etching rate of the metal-containing film to an SOC film (or a-Si film) with respect to $CF_4$ gas is 1.5 or more; and it is still more preferable that the relative etching rate of the metal-containing film to an SOC film (or a-Si film) with respect to $Cl_2$ gas is 0.2 or less, and the relative etching rate of the metal-containing film to an SOC film (or a-Si film) with respect to $CF_4$ gas is 1.8 or more.

In the disclosure, "the metal-containing film has excellent switching characteristics in a case in which the metal-containing film contains germanium element at 20 atm % or more" means that the relative etching rate of the metal-containing film to an SOC film (or a-Si film) is within the above range.

In a case in which the metal-containing film according to the disclosure has a total content of tin element, indium element, and gallium element of 1 atm % or more, the relative etching rate of the metal-containing film to an $SiO_2$ film (or $SiN_x$ film) with respect to $CF_4$ gas (i.e, etching rate of the metal-containing film according to the disclosure/etching rate of an $SiO_2$ film (or $SiN_x$ film)) is preferably 0.8 or less, more preferably 0.5 or less, and still more preferably 0.2 or less. Similarly, in a case in which the metal-containing film has a total content of tin element, indium element, and gallium element of 1 atm % or more, the relative etching rate of the metal-containing film to an $SiO_2$ film (or $SiN_x$ film) with respect to the $Cl_2$/Ar gas is preferably 2.0 or more, more preferably 5.0 or more, and still more preferably 10.0 or more.

In a case in which the metal-containing film has a total content of tin element, indium element, and gallium element of 1 atm % or more, it is preferable that the relative etching rate of the metal-containing film to an $SiO_2$ film (or $SiN_x$ film) with respect to $CF_4$ gas is 0.8 or less, and the relative etching rate of the metal-containing film to an $SiO_2$ film (or $SiN_x$ film) with respect to $Cl_2$/Ar gas is 2.0 or more; it is more preferable that the relative etching rate of the metal-containing film to an $SiO_2$ film (or $SiN_x$ film) with respect to $CF_4$ gas is 0.5 or less, and the relative etching rate of the metal-containing film to an $SiO_2$ film (or $SiN_x$ film) with respect to $Cl_2/Ar$ gas is 5.0 or more; and it is still more preferable that the relative etching rate of the metal-containing film to an $SiO_2$ film (or $SiN_x$ film) with respect to $CF_4$ gas is 0.2 or less, and the relative etching rate of the metal-containing film to an $SiO_2$ film (or $SiN_x$ film) with respect to $Cl_2/Ar$ gas is 10.0 or more.

In the disclosure, "the metal-containing film has excellent switching characteristics in a case in which the metal-containing film has a total content of tin element, indium element, and gallium element of 1 atm % or more" means that the relative etching rate of the metal-containing film to an $SiO_2$ film (or an $SiN_x$ film) is within the above range.

The relative etching rate is measured by a method as described in the Examples mentioned below.

[Size of Membrane]

When the metal-containing film is at least one layer included in the multilayer resist layer, the thickness of the metal-containing film (i.e., one layer) is, for example, from 5 nm to 900 nm, and preferably from 10 nm to 200 nm. The total thickness of the multilayer resist layer is preferably from 20 nm to 1000 nm, for example.

When the metal-containing film is a film embedded in a recess formed in at least one layer of the multilayer resist layer, the thickness of the metal-containing film (i.e., one layer) is, for example, from 5 nm to 900 nm, and preferably from 10 nm to 200 nm. The total thickness of the multilayer resist layer is preferably from 20 nm to 1000 nm, for example.

When the metal-containing film is an embedded insulating film, the thickness of the embedded insulating film (i.e., the metal-containing film) is preferably from 10 nm to 1,000 nm, and more preferably from 20 nm to 300 nm, for example. On a surface at which the recess is filled with the embedded insulating film, an insulating film may be further formed with a thickness of 500 nm or less, and preferably 200 nm or less.

[Physical Properties of Film]

The metal-containing film is preferably solid at 400° C. under an atmosphere of 1 atm from the viewpoint of heat resistance. In other words, the melting point of the metal-containing film is preferably higher than 400° C. at 400° C. and 1 atm.

The solid state of the metal-containing film at 400° C. under an atmosphere of 1 atm is confirmed by using a melting point measuring device.

The metal-containing film is more preferably solid at 500° C. under an atmosphere of 1 atm, and still more preferably solid at 600° C. under an atmosphere of 1 atm.

The melting point of the metal-containing film can be increased, for example, by reducing the amount of an organic compound contained in the metal-containing film.

<Substrate>

Examples of the substrate include a semiconductor substrate (or a semiconductor device) such as a silicon substrate, a circuit board (for example, a printed wiring board), a glass substrate, a quartz substrate, a stainless steel substrate, and a plastic substrate. The shape of the substrate is not particularly limited, and may be any shape such as a plate shape or a dish shape. For example, the silicon substrate may be a silicon substrate on which an interlayer insulation layer (e.g., low-k film) is formed, or a silicon substrate on which a fine groove (i.e., recess), fine through hole, or the like is formed.

<Multilayer Resist Layer>

Examples of the multilayer resist layer include a resist layer having an upper layer and a lower layer, and may be a resist layer having an upper layer, an intermediate layer, and a lower layer.

Examples of the upper layer include known photoresist films. For example, a photoresist film formed of an organic compound is preferable.

The upper layer may be the metal-containing film described above.

Examples of the lower layer include a silicon-containing inorganic film, an a-Si film, an $SiO_2$ film, an $SiN_x$ film, an SiON film by CVD (chemical vapor deposition) or ALD (atomic layer deposition); an SOG film, an SOC film, and a crosslinkable silsesquioxane film as films obtained by spin coating; and a film containing a silicon-containing compound obtained by hydrolysis or condensation of a silicon compound.

Particularly, in a case in which the lower layer is an $SiO_2$ film or an $SiN_x$ film, the upper layer may be the above-described metal-containing film.

From the viewpoint of switching characteristics, the combination of the resist layer and the metal-containing film according to the disclosure is preferably a combination of the following Aspect 1 or Aspect 2.

(Aspect 1)

An aspect in which the multilayer resist layer includes at least one of a spin-on-carbon (SOC) film or an amorphous silicon (a-Si) film, and the metal-containing film has a content of germanium element of 20 atm % or more as measured by X-ray photoelectric spectroscopy.

In the above-described Aspect 1, the metal-containing film is preferably located closer to a substrate than the SOC film or the a-Si film.

(Aspect 2)

An aspect in which the multilayer resist layer includes at least one of a silicon dioxide ($SiO_2$) film or a silicon nitride ($SiN_x$) film, and the metal-containing film has a total content of tin element, indium element, and gallium element of 1 atm % or more, as measured by X-ray photoelectric spectroscopy.

In the above-described Aspect 2, the metal-containing film may be located closer to a substrate than the $SiO_2$ film or the $SiN_x$ film, or may be located far from a substrate.

The SOC film that is used in the disclosure is preferably a film containing an aromatic compound, a cyclic hydrocarbon, or the like from the viewpoint of heat resistance.

Examples of the intermediate layer include the above-described metal-containing film.

The multilayer resist layer may further include one or more layers such as an intermediate layer made of a known intermediate resist film.

It is assumed that the inclusion of the metal-containing film of the disclosure as an upper layer or an intermediate layer is preferable, in that formation of an additional intermediate layer such as a carbon hard mask film is not required when processing a lower layer, that wet cleaning to remove additional intermediate layers is not required, that deformation, pattern collapse, and the like due to wet cleaning can be suppressed, and the like as described above.

When an intermediate layer or an upper layer is the metal-containing film according to the disclosure, it is preferable to use as a combination of the intermediate or upper layer and the lower layer a combination having different etching rates with respect to a specific gas, from the viewpoint of obtaining the above-described effect. When the intermediate layer or the upper layer is the metal-containing film according to the disclosure, the metal-containing film and the lower layer are preferably in contact with each other from the viewpoint of obtaining the above-described effect.

—Recess—

In a case in which the metal-containing film is a film embedded in a recess formed in at least one layer of the multilayer resist layer, a substrate that includes at least one layer of the multilayer resist layer including a recess is preferably used. The recess may be formed in any of an upper layer, an intermediate layer, and a lower layer, and is preferably formed in the lower layer. The recess may reach a substrate. Such a recess reaching a substrate is one aspect of the recess formed in a lower layer.

In a case in which the metal-containing film is formed in a lower layer, the above-described self-aligned processing-alignment correction can be efficiently performed.

In an upper or lower layer after pattern formation by development or etching, a reverse resist can be formed by replacing locations where a resist layer is removed to form a recess with a metal-containing film.

For example, when the metal-containing film is embedded in a recess formed in an SOC film and then etching is performed using $Cl_2$ gas, a location where the metal-containing film is embedded is not etched, whereby a concave portion and a convex portion can be reversed (reverse patterning).

Examples of the recess include a groove (for example, a trench) and a hole (for example, a via).

As the recess, for example, a recess (such as an element isolation groove or a via) formed by etching a member such as a lower layer is preferable.

The depth of the recess is preferably from 10 nm to 500 nm, and more preferably from 20 nm to 200 nm.

The width of the recess is not particularly limited, and can be set, for example, in the range of from 5 nm to 300 nm.

When the recess is a hole, the width of the recess is preferably from 10 nm to 200 nm, and more preferably from 10 nm to 100 nm.

In the disclosure, the width of the recess means the width of a groove when the recess is a groove, and the diameter of a surface opening when the recess is a hole.

From the viewpoint of embedding properties, the aspect ratio (depth/width) value of the recess is preferably from 0.5 to 20, and more preferably from 0.5 to 10.

In the disclosure, in a case in which the metal-containing film has a content of germanium element of 20 atm % or more, or a total content of tin element, indium element, and gallium element of from 1 atm % to 30 atm %, generation of a void inside the recess can be further suppressed when the width of the recess is from 5 nm to 300 nm. In a case in which the metal-containing film contains tin element, the total content of tin element, indium element, and gallium element is more preferably 2 atm % or more, and still more preferably 5 atm % or more.

The metal-containing film may be formed (i.e., filled) only inside the recess, or may be formed (i.e., filled) inside the recess and further protrudes to the outside of the recess (i.e., above the recess and a flat portion around the recess).

The metal-containing film is in contact with a bottom of the recess. The fact that a metal-containing film is in contact with a bottom of the recess can be confirmed by observing a section perpendicular to the film surface direction of the metal-containing film using a scanning electron microscope (SEM).

[Member on which Embedded Insulating Film is Formed]

When the metal-containing film is an embedded insulating film, a member including a recess is preferably used for the semiconductor element intermediate according to the disclosure. Examples of the member including a recess include a substrate including a recess.

In the disclosure, the embedded insulating film is an insulating film that is formed in the member including a recess in a region including the recess by being at least partially embedded (i.e., filled) in the recess.

The substrate has the same meaning as the substrate in a case in which the metal-containing film is a film embedded in a recess formed in at least one layer of the multilayer resist layer as above-described, and a preferred aspect thereof is also the same.

—Recess—

Examples of the recess include a groove (for example, a trench) and a hole (for example, a via).

Specific examples of the recess include a recess formed by etching or the like on a member (for example, substrate) (such as an element isolation groove, or a via); and a recess defined by side surfaces of plural conductive portions (such as a metal electrode or wiring made of Cu or the like) provided on a member (for example, substrate) and a surface of the member.

The embedded insulating film may be formed (i.e., filled) only inside the recess, or may be formed (i.e., filled) inside the recess and further protrudes to the outside of the recess (for example, above the recess and a flat portion around the recess).

Examples of the embedded insulating film include a Shallow Trench Isolation film, a Pre Metal Dielectric film, and an inter-wiring layer insulating film.

The Shallow Trench Isolation film (STI film) is an insulating film formed in a trench formed in a silicon substrate, which is formed for isolation of a transistor on the silicon substrate.

The Pre Metal Dielectric film (PMD film) is an insulating film formed between element electrodes, such as a transistor, a resistor, and a capacitor formed on a semiconductor substrate, and metal wirings formed on the upper side of the element electrodes.

The inter-wiring layer insulating film (1 MB film: Inter Metal Dielectric film or ILD film: Inter Layer Dielectric film) is an insulating film formed between metal wirings.

The depth of the recess is preferably from 10 nm to 1,000 nm, and more preferably from 20 nm to 500 nm.

When the recess is a hole, the recess has preferably a width of from 10 nm to 200 nm, and more preferably from 10 nm to 100 nm.

From the viewpoint of embedding properties, the aspect ratio (depth/width) value of the recess is preferably from 0.5 to 20, and more preferably from 0.5 to 10.

More specifically, in a case in which the embedded insulating film is a Shallow Trench Isolation film (STI film), the depth of the recess is from 10 nm to 1000 nm, and preferably from 30 nm to 300 nm. On a surface at which the recess is filled with the embedded insulating film, an insulating film may be further formed with a thickness of 500 nm or less, and preferably 200 nm or less.

In a case in which the embedded insulating film is a Pre Metal Dielectric film (PMD film), the depth of the recess is from 10 nm to 500 nm, and preferably from 20 nm to 300 nm. On a surface at which the recess is filled with the embedded insulating film, an insulating film may be further formed with a thickness of 500 nm or less, and preferably 200 nm or less.

In a case in which the embedded insulating film is an inter-wiring layer insulating film (e.g., IMD film, ILD film, or the like), the depth of the recess is from 30 nm to 400 nm, and preferably from 50 nm to 300 nm. On a surface at which the recess is filled with the embedded insulating film, an insulating film may be further formed with a thickness of 500 nm or less, and preferably 300 nm or less.

The embedded insulating film is preferably formed using a technique (such as shallow trench isolation) in which an embedded insulating film is provided in a groove of a silicon substrate to form an element isolation region.

When forming the embedded insulating film in a groove having a narrow recess and a large aspect ratio (depth/width), from the viewpoint of improving the filling properties to a groove, it is preferable to form the embedded insulating film by applying a composition for forming a metal-containing film according to the disclosure, which will be described below, to the recess (preferably, by spin coating).

(Method of Producing Semiconductor Element Intermediate)

A first aspect of the method of producing the semiconductor element intermediate according to the disclosure includes steps of: preparing a member for forming a metal-containing film (hereinafter, also referred to as a preparation step); and forming a metal-containing film by sputtering on the member for forming a metal-containing film (hereinafter, also referred to as a sputtering step).

A second aspect of the method of producing the semiconductor element intermediate according to the disclosure includes steps of: preparing a member for forming a metal-containing film (hereinafter, also referred to as a preparation step); applying a composition for forming a metal-containing film, which will be described below, on the member for forming a metal-containing film (hereinafter, also referred to as a composition applying step); and firing the applied composition for forming a metal-containing film (hereinafter, also referred to as a firing step).

Hereinafter, a preferred aspect of each of the steps in each aspect will be explained in detail.

<Preparation Step>

The method of producing the semiconductor element intermediate according to the disclosure includes a step of preparing a member for forming a metal-containing film (or that is to say, a preparation step) before a step of sputtering in the first aspect or a step of applying a composition in the second aspect.

In the step of preparing the member for forming a metal-containing film, a member for forming a metal-containing film that is prepared in advance and stored, a member for forming a metal-containing film that is obtained by purchase or the like, or a member for forming a metal-containing film that is produced by etching, manufacturing of wiring, or the like, may be used.

[Member for Forming Metal-Containing Film]

Examples of the member for forming a metal-containing film include a member that is a substrate including at least one layer of the multilayer resist layer, or a member including a recess.

Examples of the member including a recess include: a substrate including at least one layer of the multilayer resist layer and including a layer including a recess; and a substrate including a recess.

In a case in which the metal-containing film is an upper layer or an intermediate layer of the multilayer resist layer, the member that is a substrate including at least one layer of the multilayer resist layer is preferably used.

In a case in which the metal-containing film is a film embedded in a recess formed in at least one layer of the multilayer resist layer, the member including a recess is preferably used. The recess may be formed at least in the outermost layer of the resist layer formed on the substrate.

Preferred aspects of the multilayer resist layer and the substrate are as described above.

<Sputtering Step>

According to the first aspect of the method of producing the semiconductor element intermediate according to the disclosure, in the sputtering step, a metal-containing film is formed by sputtering on the member for forming a metal-containing film prepared in the above-described preparation step.

The sputtering method used in the sputtering step is not particularly limited, and a known sputtering method is used. Examples thereof include bipolar sputtering, tripolar sputtering, quadrupole sputtering, magnetron sputtering, high frequency sputtering, reactive sputtering, bias sputtering, asymmetric sputtering, and getter sputtering.

When the metal-containing film containing germanium element is desired to be formed, a target containing germanium element, such as Ge, $GeO_2$, or $GeS_2$, is preferably used as a sputtering target, from the viewpoint of setting the content of germanium element in the resulting metal-containing film to 20 atm % or more.

When the metal-containing film containing tin element is desired to be formed, a target containing tin element, such as $SnO_2$ (tin oxide), is preferably used, from the viewpoint of setting the content of tin element in the resulting metal-containing film to 1 atm % or more.

When the metal-containing film containing indium element is desired to be formed, a target containing indium element, such as $In_2O_3$ (indium oxide), is preferably used, from the viewpoint of setting the content of indium element in the resulting metal-containing film to 1 atm % or more.

When the metal-containing film containing gallium element is desired to be formed, a target containing gallium element, such as GaO (gallium oxide), is preferably used, from the viewpoint of setting the content of gallium element in the resulting metal-containing film to 1 atm % or more.

As other sputtering conditions, known conditions can be adopted depending on the type of a target.

According to the sputtering step, when the member having a recess is used, the metal-containing film is formed in the recess in such a manner to be in contact with a bottom of the recess.

<Composition Applying Step>

According to the second aspect of the method of producing the semiconductor element intermediate according to the disclosure, in the composition applying step, the composition for forming a metal-containing film described below is applied on the member for forming the metal-containing film prepared in the above-described preparation step.

The method of applying the composition for forming a metal-containing film onto the member for forming a metal-containing film is not particularly limited, and the usually used method can be used.

Examples of the usually used method include dipping, spraying, spin coating, and bar coating. For example, in the case of forming a film having a nano-sized film thickness (i.e., from several nm to several hundred nm), it is preferable to use spin coating.

The method of applying the composition for forming a metal-containing film by spin coating is not particularly limited. For example, a method of dropping the composition for forming a metal-containing film on the surface of the member for forming a metal-containing film while rotating the member for forming a metal-containing film with a spin coater, and then increasing the number of rotations of the member for forming a metal-containing film and drying the member can be used.

In the method of applying the composition for forming a metal-containing film by spin coating, various conditions such as the number of rotations of the member for forming a metal-containing film, the amount and time of dropping of the composition for forming a metal-containing film, the number of rotations of the member for forming a metal-containing film during drying are not particularly limited, and can be appropriately adjusted in consideration of the thickness of the film to be formed.

The humidity in a chamber of a spin coater used in spin coating is preferably kept at 30% RH or less. The humidity of 30% RH or less is preferable because a uniform metal-containing film can be obtained and switching characteristics and embedding properties tend to be further improved. The humidity of 30% RH or less and use of the composition for forming a metal-containing film containing a germanium alkoxide compound are preferable since a uniform metal-containing film is obtained and the switching characteristics and embedding properties tend to be further improved.

In the composition applying step, when the member including a recess is used as the member for forming a metal-containing film, the composition for forming a metal-containing film is preferably applied to the inside of the recess in such a manner to be in contact with a bottom of the recess. However, when the metal-containing film formed after the firing step described below is in contact with a bottom of the recess, it is not necessary to the composition for forming a metal-containing film is in contact with a bottom of the recess in the applying step.

"The composition for forming a metal-containing film is in contact with a bottom of a recess" in the composition applying step means that the composition is not necessary in contact with an entire bottom of the recess as long as it is in contact with at least a part of a bottom of the recess.

"The metal-containing film formed after the firing step is in contact with a bottom of the recess" means that the metal-containing film to be formed is not necessary in contact with an entire bottom of the recess as long as it is contact with at least a part of a bottom of the recess.

<Drying Step>

The second aspect of the method of producing of the semiconductor element intermediate according to the disclosure may include the step of drying the member to which the composition for forming a metal-containing film is applied (hereinafter, also referred to as a drying step) before the firing step described below.

In the disclosure, drying means removing at least a part of a solvent contained in the composition for forming a metal-containing film.

The drying temperature is preferably from 80° C. to 300° C., more preferably from 90° C. to 280° C., and still more preferably from 100° C. to 260° C.

The drying temperature refers to the temperature of the surface of the member for forming a metal-containing film to which the composition for forming a metal-containing film is applied.

Drying in this step can be performed by the usual method. For example, drying can be performed using a hot plate.

The atmosphere in which drying is performed in this step is not particularly limited, and may be performed, for example, under an air atmosphere or an inert gas (such as nitrogen gas, argon gas, helium gas, or the like) atmosphere.

Furthermore, from the viewpoint of filling properties (i.e., embedding properties) into a fine groove, drying may be performed under reduced pressure in order to remove a bubble in a film.

The drying time is not particularly limited, and is preferably 300 seconds or less, more preferably 200 seconds or less, still more preferably 120 seconds or less, and particularly preferably 80 seconds or less.

The lower limit of the drying time is not particularly limited, and can be, for example, 10 seconds (preferably 20 seconds, and more preferably 30 seconds).

<Washing Step>

The method of producing the semiconductor element intermediate according to the disclosure may include the step of washing the member to which the composition for forming a metal-containing film is applied with water or the like (hereinafter, also referred to as a washing step) after the above-described sputtering step in the first aspect or the above-described composition applying step in the second aspect, and before the firing step described below, in order to remove excess composition for forming a metal-containing film applied to the member. When the second aspect of the method of producing the semiconductor element intermediate according to the disclosure includes the above-described drying step, it is preferable to perform the washing step after the drying step.

<Firing Step>

The second aspect of the method of producing the semiconductor element intermediate according to the disclosure includes the step of firing the applied composition for forming a metal-containing film.

The temperature in firing (so-called firing temperature) is preferably from 200° C. to 800° C., more preferably from 250° C. to 600° C., and still more preferably from 300° C. to 500° C.

The firing temperature refers to the temperature of the surface of the member for forming a metal-containing film to which the composition for forming a metal-containing film is applied.

The pressure during heating in the firing step is not particularly limited, and is preferably from more than 17 Pa to atmospheric pressure in absolute pressure.

The absolute pressure is more preferably from 1,000 Pa to atmospheric pressure, still more preferably from 5,000 Pa to atmospheric pressure, and particularly preferably from 10,000 Pa to atmospheric pressure.

Heating in the firing step can be performed by the conventional method using a furnace, a hot plate, or the like. As the furnace, for example, SPX-1120 manufactured by APPEX CORPORATION, VF-1000LP manufactured by Koyo Thermo Systems Co., Ltd., or the like can be used.

Heating in this step may be performed under an air atmosphere or an inert gas (such as nitrogen gas, argon gas, helium gas, or the like) atmosphere.

The heating time (also referred to as firing temperature) in the firing step is not particularly limited, and is, for example, 1 hour or less, preferably 50 minutes or less, more preferably 30 minutes or less, and particularly preferably 15 minutes or less. The lower limit of the heating time is not particularly limited, and can be 0.1 minutes, for example.

For the purpose of shortening the time in the firing step, the surface of the member for forming a metal-containing film to which the composition for forming a metal-containing film is applied may be irradiated with an ultraviolet ray. As the ultraviolet light, ultraviolet light having a wavelength of from 170 nm to 230 nm, excimer light having a wavelength of 222 nm, excimer light having a wavelength of 172 nm, and the like are preferable. The ultraviolet irradiation is preferably performed under an inert gas atmosphere.

(Method of Producing Semiconductor Element)

The method of producing the semiconductor element according to the disclosure is preferably a production method using the semiconductor element intermediate according to the disclosure.

The method of producing a semiconductor element according to the disclosure preferably includes the method of producing the semiconductor element intermediate according to the disclosure.

In other words, in the method of producing a semiconductor device according to the disclosure, the semiconductor element may be produced using the semiconductor element intermediate produced according to the disclosure; or the semiconductor element may be produced using the intermediate the semiconductor element intermediate according to the disclosure obtained by means such as purchase.

<First Preferred Aspect>

A first preferred aspect of the method of producing the semiconductor element according to the disclosure is an aspect in which the metal-containing film of the semiconductor element intermediate according to the disclosure is used as a resist film.

As an example, although not particularly limited thereto, the first preferred aspect includes at least a step of preparing the semiconductor element intermediate according to the disclosure and a step of etching the semiconductor element intermediate.

More specific examples thereof include a method of producing a semiconductor device, including steps of preparing a member including a resist layer including an upper layer and a lower layer and exposing and etching the upper layer; etching the lower layer; forming a metal-containing film in a recess formed in the lower layer; exposing and etching the upper layer again: and etching the lower layer again, in which the metal-containing film has a content of germanium element of 20 atm % or more, or a total content of tin element, indium element, and gallium element of 1 atm % or more, as measured by X-ray photoelectric spectroscopy.

The member including the resist layer including an upper layer and a lower layer may further include an intermediate layer as necessary. For example, the metal-containing film is included as the intermediate layer.

In a case in which the semiconductor element intermediate according to the disclosure obtained by means such as purchase is used, the step of exposing and etching the upper layer and the step of etching the lower layer may be omitted.

Hereinafter, as an example of the first preferred aspect described above, an aspect in which a member including a recess is used and a metal-containing film is formed inside the recess is described.

[Member Including Resist Layer Including Upper Layer and Lower Layer]

As the member including the resist layer including an upper layer and a lower layer, a member including a multilayer resist layer known in producing a semiconductor element can be used without particular limitation. As the multilayer resist layer, the above-described multilayer resist layer is preferably used.

[Step of Exposing and Etching Upper Layer]

In the step of exposing and etching the upper layer, for example, an exposure method and an etching method known in the field of photoresist can be used without particular limitation.

Steps known in the field of photoresist, such as heating after exposure and heating after etching, may be further performed.

By such a step, a recess is formed in the upper layer.

[Step of Etching Lower Layer]

In the step of etching the lower layer, the upper layer pattern is transferred to the lower layer. The method of transferring the upper layer pattern to the lower layer is not particularly limited, and a method known in production of a semiconductor element can be used.

For example, in a case in which the lower layer is an SOC film or an a-Si film, a method of etching the SOC film or the a-Si film using a chlorine-based gas such as $Cl_2$ gas can be used.

For example, in a case in which the lower layer is an $SiO_2$ film or an $SiN_x$ film, a method of etching the $SiO_2$ film or the $SiN_x$ film using $CF_4$ gas or the like can be used.

After transferring the upper layer pattern to the lower layer, for example, a step known in production of a semiconductor element, for example, further etching an insulating layer such as $SiO_2$ formed on a member or injecting a dopant into a film of SiC, may be performed. These operations may be performed according to the design of an eventually produced semiconductor element.

By this step, the recess formed in the upper layer reaches the lower layer. In other words, the recess is formed in the lower layer. The recess may reach the substrate. The recess reaching the substrate is one aspect of the recess formed in the lower layer.

[Step of Forming Metal-Containing Film in Recess Formed in Lower Layer]

As the method of forming the metal-containing film in the recess, the method described in the above-described method of producing the semiconductor element intermediate can be used.

The method of measuring the content of each of germanium element, tin element, indium element, and gallium element by X-ray photoelectric spectroscopy in the metal-containing film is also as described above.

Thus obtained member in which the metal-containing film is formed in the recess is an example of the semiconductor element intermediate according to the disclosure.

[Step of Exposing and Etching Upper Layer Again]

Examples of the method of exposing and etching the upper layer again include the same method as one used in the above-described step of exposing and etching the upper layer.

Before performing the step of exposing and etching the upper layer again, an upper layer may be formed again on the lower layer and the metal-containing film.

During the exposure in the method of exposing and etching the upper layer again, it is preferable to expose a region overlapping the exposure region in the step of exposing and etching the upper layer.

[Step of Etching Lower Layer Again]

In the step of etching the lower layer again, the same method as the method in the above-described step of etching the lower layer can be used.

For example, in a case in which the lower layer is an SOC film or an a-Si film, etching is performed using a chlorine-based gas such as $Cl_2$ gas.

For example, in a case in which the lower layer is an $SiO_2$ film or an $SiN_x$ film, etching is performed using $CF_4$ gas or the like.

Here, for example, in a case in which the etching rate of the metal-containing film formed in the recess of the lower layer with respect to $Cl_2$ gas is lower than the etching rate of the SOC film with respect to $Cl_2$ gas, the SOC film is removed while the metal-containing film remains without being removed in the step of etching the lower layer again.

When the metal-containing film remains in a first etched region of the lower layer and the surrounding lower layer is etched, for example, it is possible to perform a step known in producing a semiconductor element, such as further etching an insulating film such as $SiO_2$ formed on a member using the metal-containing film as a mask, or injecting a dopant into a film such as SiC. When the lower layer is a film having insulation properties such as an $SiO_2$ film or an $SiN_x$ film, a part of the lower layer may be left as an insulating film.

In other words, by using the metal-containing film as a mask, self-aligned alignment can be achieved.

These operations may be performed according to the design of an eventually produced semiconductor element.

While the aspect in which exposure is performed twice has been described as the example of the first preferred aspect, the step of exposing and etching the upper layer again and the step of etching the lower layer again may be performed plural times. A step of etching the metal-containing film may be included after the step of etching the lower layer again. In the step of etching the metal-containing film, for example, the metal-containing film may be etched using $CF_4$ gas in a case in which the metal-containing film contains 20 atm % or more of germanium element. Since the etching rate of the metal-containing film with respect to $CF_4$ gas is lower than the etching rate of an SOC film or an a-Si film with respect to $CF_4$ gas, the metal-containing film is selectively etched and removed.

In the step of etching the metal-containing film, in a case in which the metal-containing film has a total content of tin element, indium element, and gallium element of 1 atm % or more, the metal-containing film may be etched using, for example, $Cl_2$/Ar gas. Since the etching rate of the metal-containing film with respect to $Cl_2$/Ar gas is lower than the etching rate of an $SiO_2$ film or an $SiN_x$ film with respect to $Cl_2$/Ar gas, the metal-containing film is selectively etched and removed.

Depending on the design of the semiconductor element to be obtained, a step known in the field of production of a semiconductor element such as a step of ashing a resist layer or a step of forming an electrode may be further included.

Other examples of the first preferred aspect include a method of producing the semiconductor element including steps of: preparing a member including a resist layer including the upper layer and a lower layer and exposing and etching the upper layer; etching the lower layer; forming a metal-containing film in a recess formed in the lower layer; and further etching the lower layer.

In the above-described example, it is possible to obtain a pattern formed by the metal-containing film in which a convex portion and a recess portion are reversed with respect to a pattern formed in the lower layer.

As another example of the first preferred aspect, an aspect in which the semiconductor element intermediate including the above-described metal-containing film as an intermediate layer in the multilayer resist layer is described.

A specific example of the above-described example (hereinafter, also referred to as another example A) is a method of producing a semiconductor element, including steps of: forming a resist layer A on a substrate; forming a metal-containing film on the resist layer A; further forming a resist layer B different from the resist layer A on the metal-containing film; exposing and developing the resist layer B; etching the metal-containing film; etching the resist layer A; and removing the metal-containing film with an etching gas, in which the metal-containing film has a content of germanium element of 20 atm % or more, or a total content of tin element, indium element, and gallium element of 1 atm % or more, as measured by X-ray photoelectric spectroscopy.

In a case in which the semiconductor element intermediate according to the disclosure obtained by means such as a purchase is used, at least one of the step of forming the resist layer A on a substrate, the step of forming the metal-containing film on the resist layer A, or the step of forming the resist layer B different from the resist layer A on the metal-containing film may be omitted.

[Step of Forming Resist Layer a on Substrate]

The resist layer A to be formed is a layer corresponding to the lower layer in the multilayer resist layer described above.

The step of forming the resist layer A on a substrate is not particularly limited, and a known method may be used.

[Step of Forming Metal-Containing Film on Resist Layer A]

The metal-containing film formed on the resist layer A is the metal-containing film as described above, and corresponds to the intermediate layer in the above-described multilayer resist layer.

Examples of the step of forming the metal-containing film on the resist layer A include the same step as the sputtering step or the composition applying step in the method of producing the semiconductor element intermediate according to the disclosure described above.

In another example A, from the viewpoint of utilizing the switching characteristics of the metal-containing film, it is preferable to form an SOC film or an a-Si film as the lower layer (i.e., a resist layer A) and a metal-containing film having a content of germanium element of 20 atm % or more as the metal-containing film.

In another example A, from the viewpoint of utilizing the switching characteristics of the metal-containing film, it is preferable to form an $SiO_2$ film or an $SiN_x$ film as the lower layer (i.e., resist layer A) and a metal-containing film having a total content of tin element, indium element, and gallium element of 1 atm % or more as the metal-containing film.

[Step of Further Forming Resist Layer B Different from Resist Layer a on Metal-Containing Film]

The resist layer B to be formed is a layer corresponding to the upper layer in the multilayer resist layer described above, and is preferably a photoresist layer.

The step of forming the resist layer B on the substrate is not particularly limited, and a known method may be used.

[Step of Exposing and Developing Resist Layer B]

In the step of exposing and etching the resist layer B, for example, an exposure method and an etching method known in the field of photoresist can be used without particular limitation.

Steps known in the field of photoresist, such as heating after exposure and heating after etching, may be further performed.

[Step of Etching Metal-Containing Film]

In the step of etching the metal-containing film, the resist pattern formed on the resist layer B is transferred to a layer containing the metal-containing film using the developed resist layer B as a mask pattern.

The etching method of the metal-containing film is not particularly limited, and it is preferable to use an etching gas having a high etching rate for the metal-containing film and a low etching rate for the resist layer A.

[Step of Etching Resist Layer A]

In the step of etching the resist layer A, the intermediate layer pattern is transferred to the lower layer. The method of transferring the intermediate layer pattern to the lower layer is not particularly limited, and a method known in production of a semiconductor element can be used.

The step of etching the resist layer A is preferably the same as the step described in the step of etching the lower layer.

The method of etching the resist layer A is not particularly limited, and it is preferable to use an etching gas having a low etching rate for the metal-containing film and a high etching rate for the resist layer A.

[Step of Removing Metal-Containing Film with Etching Gas]

In the step of removing the metal-containing film with an etching gas, although not particularly limited, it is preferable to use an etching gas having a high etching rate for the metal-containing film and a low etching rate for the resist layer A.

As the etching gas, an etching gas same as that used in the step of etching the metal-containing film may be used.

Since the metal-containing film according to the disclosure has switching characteristics, it is possible to remove the metal-containing film while suppressing etching of the resist layer A by appropriately selecting the metal-containing film and an etching gas.

By removing the metal-containing film with an etching gas, cleaning with a cleaning liquid or the like is not required. Therefore, there is an advantage that the producing process of the semiconductor element can be simplified, and deformation of a pattern, pattern collapse, or the like due to cleaning using a cleaning liquid or the like can be suppressed.

In a case in which the resist layer A is a film having insulation properties such as an $SiO_2$ film or an $SiN_x$ film, a part of the lower layer may be left as an insulating film.

Another specific example of the first preferred aspect (hereinafter, also referred to as another example B) is a method of producing a semiconductor element, including steps of: forming a metal-containing film on a substrate; forming a resist layer A on the metal-containing film; further forming a resist layer B different from the resist layer A on the metal-containing film; exposing and developing the resist layer B; etching the resist layer A; etching the metal-containing film; and removing the metal-containing film with an etching gas, in which the metal-containing film has a total content of tin element, indium element, and gallium element measured by X-ray photoelectric spectroscopy of 1 atm % or more.

In the above-described another example B, it is preferable to use an $SiO_2$ film or an $SiN_x$ film as the resist layer A.

In the above-described other example B, the $SiO_2$ film or the $SiN_x$ film that is the resist layer A may be left as an insulating film.

In a case in which the semiconductor element intermediate according to the disclosure obtained by means such as purchase is used, at least one of the step of forming the metal-containing film on a substrate, the step of forming the resist layer A on the metal-containing film, or the step of forming the resist layer B different from the resist layer A on the resist layer A may be omitted.

The method of forming the metal-containing film, the resist layer A, and the resist layer B, the method of etching each layer, and the method of removing the metal-containing film in the above-described other example B can be performed by the same method as the method of forming the metal-containing film, the resist layer A, and the resist layer B, the method of etching each layer, and the method of removing the metal-containing film in the above-described other example A.

<Second Preferred Aspect>

A second preferred aspect of the method of producing the semiconductor element according to the disclosure is an aspect in which the metal-containing film of the semiconductor element intermediate according to the disclosure is used as an embedded insulating film.

Examples of the second preferred aspect include, but not specifically limited to, a method of producing a semiconductor element including a step of forming an embedded insulating film.

In a case in which the semiconductor element intermediate according to the disclosure obtained by means such as purchase is used, the step of forming an embedded insulating film may be omitted, and a method of producing a semiconductor element including another step described below may be employed.

According to the method of producing the semiconductor element according to the disclosure, the semiconductor element including an embedded insulating film (such as an STI film, a PMD film, an IMD film, or an ILD film) having excellent etching selectivity and excellent heat resistance can be produced. In addition, the embedded insulating film having excellent filling properties into the recess can be easily obtained.

[Step for Forming Embedded Insulating Film]

Example of the step of forming the embedded insulating film includes a step (also referred to as a sputtering step) that includes using the member including a recess and forming the metal-containing film in the recess by sputtering.

Another example of the step of forming the embedded insulating film is, for example, a step that includes applying the composition for forming a metal-containing film, which is described below, on the member including a recess (also referred to as a composition applying step), and firing the applied composition for forming a metal-containing film (also referred to as a firing step). Furthermore, a drying step may be performed before the firing step, or a cleaning step may be performed after the sputtering step or the composition applying step and before the firing step.

Since each process (such as the sputtering step, the composition applying step, the drying step, the cleaning step, or the firing step) in the step of forming the embedded insulating film is the same as each process (such as the sputtering step, the composition applying step, the drying step, the cleaning step, or the firing step) in the above-described method of producing the semiconductor element intermediate, the description thereof is omitted.

<Other Steps>

The method of producing the semiconductor device according to the disclosure may include another step.

Examples of another step include a step known in the semiconductor process.

For example, the method of producing the semiconductor element according to the disclosure may include a plasma treatment step as another step.

Examples of plasma in the plasma treatment step include plasma generated from at least one gas selected from the group consisting of helium gas, argon gas, nitrogen gas, ammonia gas, oxygen gas, hydrogen gas, and fluorocarbon-based gas.

In a case in which the method of producing the semiconductor device according to the disclosure includes the plasma treatment step, the embedded insulating film (such as an STI film, a PMD film, an IMD film, or an ILD film) tends to have excellent plasma resistance even when exposed to plasma.

In a case in which the method of producing the semiconductor element according to the disclosure includes the firing step, the embedded insulating film has excellent heat resistance.

The method of producing the semiconductor device according to the disclosure may include a removal step of removing an embedded insulating film (such as an STI film, a PMD film, an IMD film, or an ILD film) as another step. This aspect is particularly suitable when at least one of embedded insulating films is a sacrificial film.

Examples of the removal method of the embedded insulating film in the removal step include a removal method using a UV ozone treatment, and a removal method using a gas such as a plasma treatment as a removal treatment.

The embedded insulating film may be left and used as an insulating film.

(Semiconductor Element)

The semiconductor element according to the disclosure is preferably a semiconductor element obtained by the method of producing the semiconductor element according to the disclosure.

The semiconductor element according to the disclosure preferably includes the metal-containing film as the embedded insulating film, and the metal-containing film has a content of germanium element of 20 atm % or more, or a total content of tin element, indium element, and gallium element of 1 atm % or more, as measured by X-ray photoelectric spectroscopy.

Furthermore, the semiconductor element according to the disclosure preferably includes the metal-containing film as the embedded insulating film, and the metal-containing film is a cured product of the composition for forming a metal-containing film described below.

(Composition for Forming Metal-Containing Film)

The composition for forming a metal-containing film according to the disclosure is a composition that is used for forming the metal-containing film in the semiconductor element intermediate according to the disclosure, in which the composition has a content of germanium element of 20 atm % or more, or a total content of tin element, indium element, and gallium element of 1 atm % or more, as measured by X-ray photoelectric spectroscopy after firing at 400° C. for 10 minutes under a nitrogen atmosphere.

Specifically, the composition for forming a metal-containing film according to the disclosure is a composition for forming a metal-containing film, in which, when the composition is fired at 400° C. for 10 minutes under a nitrogen atmosphere to obtain a fired product, the fired product has a content of germanium element of 20 atm % or more, or a total content of tin element, indium element, and gallium element of 1 atm % or more, as measured by X-ray photoelectric spectroscopy.

In a case in which the recess is formed in at least one layer of the multilayer resist layer in the above-described semiconductor element intermediate according to the disclosure, the recess has a width of from 5 nm to 300 nm, and the metal-containing layer is formed in the recess, it is preferable that the composition for forming a metal-containing film according to the disclosure is used for embedding the recess. In this case, the metal-containing layer is preferably an embedded insulating film. In this case, by using the composition for forming a metal-containing film according to the disclosure, there is an advantage that even the recess having a narrow width as described above can be easily embedded.

<Contents of Germanium, Tin, Indium, and Gallium Elements>

The contents of the germanium element, the tin element, the indium element, and the gallium element are measured using a fired product obtained by dropping the composition for forming a metal-containing film on a silicon substrate and firing at 400° C. for 10 minutes under a nitrogen atmosphere (30 kPa) on the same conditions as those for measuring the content of each of germanium element, tin element, indium element, and gallium element in the above-described metal-containing film.

In a case in which the content of germanium element in a fired product (i.e., a metal-containing film) to be obtained is 20 atm % or more, the content of germanium element in the composition for forming a metal-containing film is 20 atm % or more, preferably 24 atm % or more, and more preferably 30 atm % or more, from the viewpoint of improving the switching characteristics. The upper limit of the content of germanium in the composition for forming a metal-containing film is not particularly limited, and may be 100 atm % or less.

In a case in which the total content of tin element, indium element, and gallium element in a fired product (i.e., a metal-containing film) to be obtained is 1 atm % or more, the above-described total content in the composition for forming a metal-containing film is 1 atm % or more, preferably from 2 atm % to 30 atm %, and more preferably from 5 atm % to 22 atm %, from the viewpoint of improving the switching characteristics.

<Composition for Composition for Forming Metal-Containing Film>

The composition for forming a metal-containing film according to the disclosure preferably includes a germanium compound; or at least one selected from the group consisting of a tin compound, an indium compound, and a gallium compound.

The details of these compounds will be described below. The composition for forming a metal-containing film preferably contains a germanium alkoxide compound, a germanium carbide compound, a germanium hydroxide, or a germanium halide; or at least one selected from the group consisting of a tin alkoxide compound, a tin carbide compound, a tin hydroxide, a tin halide, an indium alkoxide compound, an indium carbide compound, an indium hydroxide, an indium halide, a gallium alkoxide compound, a gallium carbide compound, a gallium hydroxide, and a gallium halide.

The composition for forming a metal-containing film preferably contains a solvent.

The composition for forming a metal-containing film preferably contains a solvent and a germanium compound; or a solvent and at least one selected from the group consisting of a tin compound, an indium compound, and a gallium compound, and may further contain another component.

Hereinafter, details of each component that is used in the disclosure will be described.

[Germanium Compound]

The germanium compound is not particularly limited as long as the compound includes germanium. The germanium compound preferably includes at least one selected from the group consisting of: a compound (A) which is at least one selected from the group consisting of a compound (a1) including a germanium atom and a carboxy group, and an ester of the compound (a1); a germanium alkoxide compound; a germanium carbide compound (i.e., an organic germanium compound containing no oxygen atom); a germanium hydroxide; and a germanium halide (more preferably a fluoride or a chloride). From the viewpoint of increasing the content of germanium element, the germanium compound more preferably contains at least one selected from the group consisting of a germanium alkoxide compound, a germanium carbide compound, a germanium hydroxide, and a germanium halide.

The composition for forming a metal-containing film according to the disclosure may contain the germanium compound singly or in combination of two or more kinds thereof.

From the viewpoint of further improving the switching characteristics, the content of the germanium compound in the composition for forming a metal-containing film is preferably 80% by mass or more, more preferably 90% by mass or more, still more preferably 99% by mass or more, and particularly preferably 99.9% by mass or more, with respect to the total mass of the solid content of the composition for forming a metal-containing film.

Here, the solid content is a residue obtained by removing a volatile component such as a solvent from the composition for forming a metal-containing film.

—Germanium Alkoxide Compound—

Preferred examples of the germanium alkoxide compound that is used in the disclosure include a compound represented by the following Formula GA.

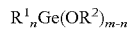
Formula GA

In Formula GA, $R^1$ represents a non-hydrolyzable group, $R^2$ represents an alkyl group having from 1 to 6 carbon atoms, m is 4 which is a valence of the germanium atom M, n is an integer from 0 to 2 when m is 4, when there are plural $R^1$s, the $R^1$s may be the same as or different from one another, and when there are plural $R^2$s, the $R^2$s may be the same as or different from one another.

$R^1$ preferably represents an alkyl group, and more preferably an alkyl group having from 1 to 6 carbon atoms.

$R^2$ preferably represents an alkyl group having from 1 to 4 carbon atoms, more preferably a methyl group or an ethyl group, and still more preferably an ethyl group, from the viewpoint of further improving the switching characteristics.

n is preferably an integer from 0 to 2, and more preferably 0, from the viewpoint of further improving the switching characteristics by forming a uniform metal-containing film.

—Compound (A)—

The compound (A) is a compound that is at least one selected from the group consisting of:

a compound (a1) including a germanium atom and a carboxy group, and an ester of the compound (a1).

The compound (A) may contain two or more germanium atoms, or may contain one or more metal atoms of the same kind selected from the group consisting of a tin atom, a selenium atom, an indium atom, and a gallium atom as a metal atom other than a germanium atom.

The ester of the compound (a1) refers to an ester compound obtained by a dehydration condensation reaction between an alcohol and the compound (a1) including a germanium atom and a carboxy group. The alcohol is not particularly limited, and examples thereof include an alcohol having from 1 to 10 carbon atoms (which may be linear, branched, or cyclic). The alkyl group of the alcohol may have a substituent.

The compound (a1) and the ester of the compound (a1) may be used singly or in combination of two or more kinds thereof.

From the viewpoint of improving the switching characteristics, the molecular weight (or the weight average molecular weight when having a molecular weight distribution) of the compound (A) is preferably from 120 to 50,000, more preferably from 150 to 10,000, still more preferably from 150 to 1,000, and particularly preferably from 150 to 600.

More specifically, when the compound (A) is a compound other than a polymer, the molecular weight (or the weight average molecular weight when having a molecular weight distribution) of the compound (A) is preferably from 120 to 10,000, more preferably from 150 to 1,000, and still more preferably from 150 to 600.

When the compound (A) is a polymer, the molecular weight (or the weight average molecular weight when having a molecular weight distribution) of the compound (A) is preferably from 200 to 50,000, more preferably from 300 to 10,000, and still more preferably from 500 to 2,000.

The compound (a1) is preferably a compound represented by the following Formula (1) or (2), or a polymer including at least one of a structural unit represented by the following Formula (3) or a structural unit represented by the following Formula (4).

«Compound Represented by Formula (1)»

The compound (a1) is preferably a compound represented by the following Formula (1).

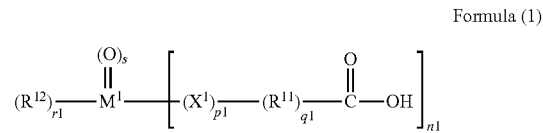
Formula (1)

In Formula (1), $M^1$ represents a germanium atom; $X^1$ represents —S—, —S—S—, —O—, —NH—, or —$NR^{13}$—, $R^{13}$ represents an alkyl group having from 1 to 10 carbon atoms; $R^{11}$ represents an alkylene group having from 1 to 10 carbon atoms which may have a substituent group; and $R^{12}$ represents a hydrogen atom, an alkyl group having from 1 to 5 carbon atoms, a hydroxy group, an alkoxy group having from 1 to 5 carbon atoms, or a halogen atom. Further, in Formula (1), p1 represents 0 or 1, q1 represents 0 or 1, n1 represents an integer of 1 or more, r1 represents an integer of 0 or more, and s represents an integer of 0 or more. Here, n1+r1+2s is 4.

Specific examples of the "alkyl group having from 1 to 10 carbon atoms" represented by $R^{13}$ in Formula (1) include a methyl group, an ethyl group, a propyl group, a butyl group, a pentyl group, a hexyl group, a heptyl group, an octyl group, a nonyl group, and a decyl group, which may be linear, branched, or cyclic.

Specific examples of the "alkylene group having from 1 to 10 carbon atoms" represented by $R^{11}$ in Formula (1) include a methylene group, an ethylene group, a propylene group, a butylene group, a pentylene group, a hexylene group, a heptylene group, an octylene group, a nonylene group, and a decalene group, which may be linear, branched, or cyclic.

Specific examples of the "alkyl group having from 1 to 5 carbon atoms" represented by $R^{12}$ in Formula (1) include a methyl group, an ethyl group, a propyl group, a butyl group, and a pentyl group, which may be linear, branched, or cyclic.

Specific examples of the "alkoxy group having from 1 to 5 carbon atoms" represented by $R^{12}$ include a methoxy group, an ethoxy group, a propoxy group, a butoxy group, and a pentyloxy group, which may be linear, branched, or cyclic.

Examples of the substituent group in the "alkylene group having from 1 to 10 carbon atoms which may have a substituent group" represented by $R^{11}$ in Formula (1) include one or more substituents selected from the group consisting of an amino group, a carboxyamino group, an alkoxy group, an alkylamino group, and a carbamoyl group. When the alkylene group is substituted with two or more substituents, the substituents may be the same as or different from one another.

In Formula (1), $X^1$ preferably represents —O—, —NH—, or —$NR^{13}$—, $R^{13}$ preferably represents an alkyl group having from 1 to 6 carbon atoms.

In Formula (1), $R^{11}$ preferably represents alkylene group having from 1 to 6 carbon atoms. The substituent in the "alkylene group having from 1 to 10 carbon atoms which may have a substituent group" represented by $R^{11}$ is preferably an amino group or a carboxyamino group.

In Formula (1), $R^{12}$ preferably represents an alkyl group having from 1 to 3 carbon atoms.

In Formula (1), from the viewpoint of the stability of the compound (A) in a solution (difficulty of polymerization by hydrolysis or the like), p1 is preferably 0. q1 is preferably 1.

Specific examples of the compound represented by Formula (1) (compound (a1)) include the following Aspects 1 to 4.

Aspect 1: An aspect in which p1 is 0, and q1 is 1 in Formula (1).

Aspect 2: An aspect in which n1 is 2 or more in Formula (1) (provided that p1 is 0 and q1 is 1).

Aspect 3: An aspect in which, in Formula (1), n1 is 2 or more (provided that p1 is 0 and q1 is 1), and no sulfur atom is contained in the molecule.

Aspect 4: An aspect in which a hydroxy group is not directly bonded to $M^1$ among any of the aspects 1 to 3.

Specific examples of the compound represented by Formula (1) that is preferable as the compound (a1) include the following, but examples are not limited thereto.

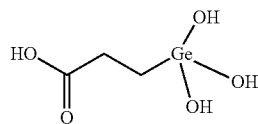

(a1-18)

«Compound Represented by Formula (2)»

Preferable examples of the compound (a1) also include a compound represented by the following Formula (2).

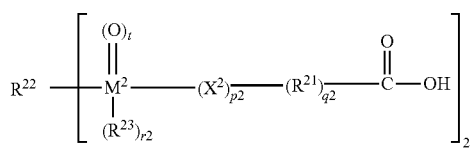

Formula (2)

In Formula (2), $M^2$ represents a germanium atom; $X^2$ represents —S—, —S—S—, —O—, —NH—, or —$NR^{24}$—, $R^{24}$ represents an alkyl group having from 1 to 10 carbon atoms; $R^{21}$ represents an alkylene group having from 1 to 10 carbon atoms which may have a substituent group; $R^{22}$ represents a single bond, —O—, or —$NR^{25}$—, $R^{25}$ represents an alkyl group having from 1 to 10 carbon atoms which may have a substituent group; $R^{23}$ represents a hydrogen atom, an alkyl group having from 1 to 5 carbon atoms, a hydroxy group, an alkoxy group having from 1 to 5 carbon atoms, or a halogen atom; p2 is 0 or 1; q2 is 0 or 1; r2 is an integer of 0 or more; and t is an integer of 0 or more. Here, r2+2t+2 is 4.

The "alkyl group having from 1 to 10 carbon atoms" in each of the "alkyl group having from 1 to 10 carbon atoms" represented by $R^{24}$ and the "alkyl group having from 1 to 10 carbon atoms which may have a substituent group" represented by $R^{25}$ in Formula (2) has the same meaning as the "alkyl group having from 1 to 10 carbon atoms" represented by $R^{13}$ in Formula (1).

The "alkylene group having from 1 to 10 carbon atoms" represented by $R^{21}$ in Formula (2) has the same meaning as the "alkylene group having from 1 to 10 carbon atoms" represented by $R^{11}$ in Formula (1).

The "alkyl group having from 1 to 5 carbon atoms" represented by $R^{23}$ in Formula (2) has the same meaning as the "alkyl group having from 1 to 5 carbon atoms" represented by $R^{12}$ in Formula (1).

The "alkoxy group having from 1 to 5 carbon atoms" represented by $R^{23}$ in Formula (2) has the same meaning as the "alkoxy group having from 1 to 5 carbon atoms" represented by $R^{12}$ in Formula (1).

Examples of the substituent group in the "alkylene group having from 1 to 10 carbon atoms which may have a substituent group" represented by $R^{21}$ in Formula (2) include one or more substituents selected from the group consisting of an amino group, a carboxyamino group, an alkoxy group, an alkylamino group, and a carbamoyl group. When the alkylene group is substituted with two or more substituents, the substituents may be the same as or different from one another.

In Formula (2), $X^2$ represents —S—, —S—S—, —O—, —NH—, or —$NR^{24}$—, in which $R^{24}$ represents an alkyl group having from 1 to 10 carbon atoms. $X^2$ preferably represents —O—, —NH— or —$NR^{24}$—. $R^{24}$ preferably represents an alkyl group having from 1 to 6 carbon atoms.

In Formula (2), $R^{21}$ represents an alkylene group having from 1 to 10 carbon atoms which may have a substituent group. $R^{21}$ preferably represents an alkylene group having from 1 to 6 carbon atoms. The substituent group in the "alkylene group having from 1 to 10 carbon atoms which may have a substituent group" represented by $R^{21}$ is preferably an amino group or a carboxyamino group.

In Formula (2), $R^{22}$ represents a single bond, —O—, or —$NR^{25}$—, in which $R^{25}$ represents an alkyl group having from 1 to 10 carbon atoms which may have a substituent group. $R^{22}$ preferably represents —O—.

In Formula (2), $R^{23}$ represents a hydrogen atom, an alkyl group having from 1 to 5 carbon atoms, a hydroxy group, an alkoxy group having from 1 to 5 carbon atoms, or a halogen atom. $R^{23}$ preferably represents an alkyl group having from 1 to 3 carbon atoms.

In Formula (2), p2 is 0 or 1, and q2 is 0 or 1. p2 is preferably 0. q2 is preferably 1.

Specific examples of the compound represented by Formula (2) (compound (a1)) include the following Aspects 1 to 3.

Aspect 1: An aspect in which p2 is 0, and q2 is 1 in Formula (2).

Aspect 2: An aspect in which, in Formula (2), p2 is 0, q2 is 1, and no sulfur atom is contained in the molecule.

Aspect 3: An aspect in which a hydroxy group is not directly bonded to $M^2$ among aspect 1 or 2.

Specific examples of the compound represented by Formula (2) that is preferable as the compound (a1) include the following, but examples are not limited thereto. From the viewpoint of obtaining the metal-containing film having further improved etching selectivity and heat resistance, a compound represented by (A-21) is preferable.

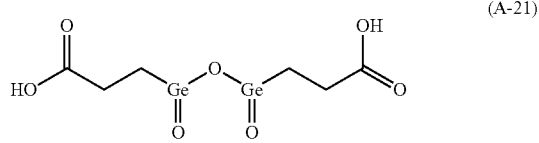

(A-21)

«Polymer Having Constitutional Unit Represented by Formula (3)»

Preferable examples of the compound (a1) also include a polymer including a constitutional unit represented by the following Formula (3).

The polymer including a constitutional unit represented by the following Formula (3) can be obtained from the compound represented by Formula (1), for example. Specifically, a polymer such as a linear polymer, a cage structure, or a dendritic structure with an M-O-M bond (M: one selected from the group consisting of a germanium atom, a tin atom, an indium atom, and a gallium atom) can be obtained from the compound represented by Formula (1). The shape of the polymer to be obtained is not particularly limited, and may be a linear polymer, a cage structure, or a dendritic structure.

The polymer having the structural unit represented by Formula (3) may be a polymer of plural metal compounds. Specifically, the polymer having the structural unit represented by Formula (3) may be a polymer including one kind of metal atom selected from the group consisting of a germanium atom, a tin atom, an indium atom, and a gallium atom.

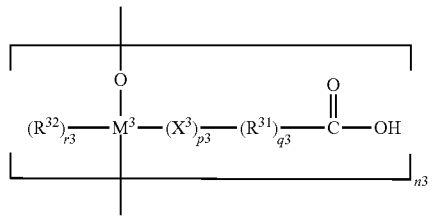

Formula (3)

In Formula (3), $M^3$ represents a germanium atom, a tin atom, an indium atom, or a gallium atom; $X^3$ represents —S—, —S—S—, —O—, —NH—, or —$NR^{33}$—, in which $R^{33}$ represents an alkyl group having from 1 to 10 carbon atoms; $R^{31}$ represents an alkylene group having from 1 to 10 carbon atoms which may have a substituent group; $R^{32}$ represents a hydrogen atom, an alkyl group having from 1 to 5 carbon atoms, a hydroxy group, an alkoxy group having from 1 to 5 carbon atoms, or a halogen atom; p3 is 0 or 1; q3 is 0 or 1; r3 is 0 or 1, wherein r3 is 0 represents a bond; n3 is an integer of 2 or more; and at least one of n3 number of $M^3$s represents a germanium atom.

The "alkyl group having from 1 to 10 carbon atoms" represented by $R^{33}$ in Formula (3) has the same meaning as the "alkyl group having from 1 to 10 carbon atoms" represented by $R^{13}$ in Formula (1).

The "alkylene group having from 1 to 10 carbon atoms" represented by $R^{31}$ in Formula (3) has the same meaning as the "alkylene group having from 1 to 10 carbon atoms" represented by $R^{11}$ in Formula (1).

The "alkyl group having from 1 to 5 carbon atoms" represented by $R^{32}$ in Formula (3) has the same meaning as the "alkyl group having from 1 to 5 carbon atoms" represented by $R^{12}$ in Formula (1).

The "alkoxy group having from 1 to 5 carbon atoms" represented by $R^{32}$ in Formula (3) has the same meaning as the "alkoxy group having from 1 to 5 carbon atoms" represented by $R^{12}$ in Formula (1).

Examples of the substituent group in the "alkylene group having from 1 to 10 carbon atoms which may have a substituent group" represented by $R^{31}$ in Formula (3) include one or more substituents selected from the group consisting of an amino group, a carboxyamino group, an alkoxy group, an alkylamino group, and a carbamoyl group. When the alkylene group is substituted with two or more substituents, the substituents may be the same as or different from one another.

In Formula (3), $X^3$ preferably represents —O—, —NH—, or —$NR^{33}$—.

In Formula (3), $R^{33}$ preferably represents an alkyl group having from 1 to 6 carbon atoms.

In Formula (3), $R^{31}$ preferably represents an alkylene group having from 1 to 6 carbon atoms, and the substituent in the "alkylene group having from 1 to 10 carbon atoms which may have a substituent group" represented by $R^{31}$ is preferably an amino group or a carboxyamino group.

In Formula (3), $R^{32}$ preferably represents an alkyl group having from 1 to 3 carbon atoms.

In Formula (3), p3 is preferably 0. q3 is preferably 1.

In Formula (3), r3 is preferably 1.

In Formula (3), n3 is preferably from 2 to 250.

Specific examples of the polymer including the structural unit represented by Formula (3) that is preferable as the compound (a1) include a polymer including a constitutional unit represented by the following Formula (3A), but examples are not limited thereto.

In Formula (3A), n is preferably from 2 to 130.

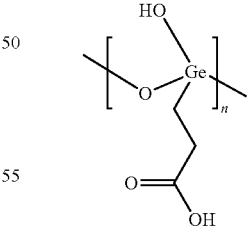

Formula (3A)

«Polymer Having Constitutional Unit Represented by Formula (4)»

Preferable examples of the compound (a1) also include a polymer including a constitutional unit represented by the following Formula (4).

The polymer including a constitutional unit represented by the following Formula (4) can be obtained from the compound represented by Formula (2), for example. Specifically, a polymer such as a linear polymer with an M-O-M bond (M: one selected from the group consisting of a germanium atom, a tin atom, an indium atom, and a gallium atom) can be obtained from the compound represented by Formula (2), for example. The shape of the polymer to be obtained is not particularly limited.

The polymer including a constitutional unit represented by Formula (4) may be a polymer of plural metal compounds. Specifically, the polymer having the constitutional unit represented by Formula (4) may be a polymer including one kind of metal atom selected from the group consisting of a germanium atom, a tin atom, an indium atom, and a gallium atom.

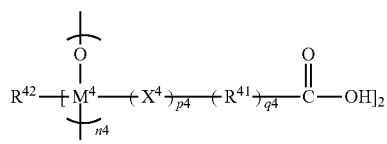

Formula (4)

In Formula (4), $M^4$ represents a germanium atom, a tin atom, an indium atom, or a gallium atom; $X^4$ represents —S—, —S—S—, —O—, —NH—, or —$NR^{43}$—, in which $R^{43}$ represents an alkyl group having from 1 to 10 carbon atoms; $R^{41}$ represents an alkylene group having from 1 to 10 carbon atoms which may have a substituent group; $R^{42}$ represents a single bond, —O—, or —$NR^{44}$—, in which $R^{44}$ represents an alkyl group having from 1 to 10 carbon atoms which may have a substituent group; p4 is 0 or 1; q4 is 0 or 1; n4 is an integer of 2 or more; and at least one of 2×n4 number of $M^0$s represents a germanium atom.

In Formula (4), the "alkyl group having 1 to 10 carbon atoms" in each of the "alkyl group having from 1 to 10 carbon atoms" represented by $R^{43}$ and the "alkyl group having from 1 to 10 carbon atoms which may have a substituent group" represented by $R^{44}$ has the same meaning as the "alkyl group having from 1 to 10 carbon atoms" represented by $R^{13}$ in Formula (1).

In Formula (4), the "alkylene group having from 1 to 10 carbon atoms" represented by $R^{41}$ has the same meaning as the "alkylene group having from 1 to 10 carbon atoms" represented by $R^{11}$ in Formula (1).

In Formula (4), examples of the substituent group in the "alkylene group having from 1 to 10 carbon atoms which may have a substituent group" represented by $R^{41}$ include one or more substituents selected from the group consisting of an amino group, a carboxyamino group, an alkoxy group, an alkylamino group, and a carbamoyl group. When the alkylene group is substituted with two or more substituents, each substituent may be the same as or different from one another.

In Formula (4), examples of the substituent group in the "alkyl group having 1 to 10 carbon atoms which may have a substituent group" represented by $R^{44}$ include one or more substituents selected from the group consisting of an amino group, a carboxyamino group, an alkoxy group, an alkylamino group, and a carbamoyl group. When the alkyl group is substituted with two or more substituents, the substituents may be the same as or different from one another.

In Formula (4), $M^4$ is preferably a germanium atom or a tin atom, and more preferably a germanium atom.

In Formula (4), $X^4$ preferably represents O—, —NH—, or —$NR^{43}$—.

In Formula (4), $R^{43}$ preferably represents an alkyl group having from 1 to 6 carbon atoms.

In Formula (4), $R^{41}$ preferably represents an alkylene group having from 1 to 6 carbon atoms, and the substituent group in the "alkylene group having from 1 to 10 carbon atoms which may have a substituent group" represented by $R^{41}$ is preferably an amino group or a carboxyamino group.

In Formula (4), $R^{42}$ preferably represents —O—.

In Formula (4), p4 is preferably 0. q4 is preferably 1.

In Formula (4), n4 is preferably from 2 to 130.

Specific examples of the polymer including the structural unit represented by Formula (4) that is preferable as the compound (a1) include a polymer including a structural unit represented by the following Formula (4A), but examples are not limited thereto.

The polymer including a structural unit represented by Formula (4A) is one example of the polymer of the compound represented by Formula (A-21). In Formula (4A), n is preferably from 2 to 130.

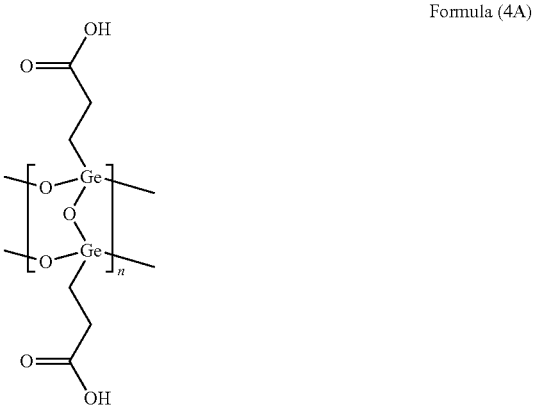

Formula (4A)

[Tin Compound]

The tin compound is not particularly limited as long as the compound includes tin. The tin compound preferably includes at least one selected from the group consisting of a tin alkoxide compound, a tin carbide compound (i.e., an organic tin compound containing no oxygen atom), a tin hydroxide, and a tin halide (more preferably a fluoride or a chloride). From the viewpoint of increasing the content of the above-described tin element, the tin compound more preferably includes at least one selected from the group consisting of a tin alkoxide compound, a tin carbide compound, a tin hydroxide, and a tin halide.

The composition for forming a metal-containing film according to the disclosure may contain the tin compound singly or in combination of two or more kinds thereof.

From the viewpoint of further improving the switching characteristics, the content of the tin compound in the composition for forming a metal-containing film is preferably 80% by mass or more, more preferably 90% by mass or more, still more preferably 99% by mass or more, and particularly preferably 99.9% by mass or more, with respect to the total mass of the solid content of the composition for forming a metal-containing film.

[Indium Compound]

The indium compound is not particularly limited as long as the compound includes indium. The indium compound preferably contains at least one selected from the group consisting of an indium alkoxide compound, an indium carbide compound (i.e., an organic indium compound containing no oxygen atom), an indium hydroxide, and an indium halide (more preferably a fluoride or a chloride). From the viewpoint of increasing the content of the indium element, the indium compound more preferably contains at least one selected from the group consisting of an indium alkoxide compound, an indium carbide compound, an indium hydroxide, and an indium halide.

The composition for forming a metal-containing film according to the disclosure may contain the indium compound singly, or in combination of two or more kinds thereof.

From the viewpoint of further improving the switching characteristics, the content of the indium compound in the composition for forming a metal-containing film is preferably 80% by mass or more, more preferably 90% mass or more, still more preferably 99% mass or more, and especially preferably 99.9% mass or more, with respect to the total mass of the solid content of the composition for forming a metal-containing film.

[Gallium Compound]

The gallium compound is not particularly limited as long as the compound includes gallium. The gallium compound preferably contains at least one selected from the group consisting of an gallium alkoxide compound, an gallium carbide compound (i.e., an organic gallium compound containing no oxygen atom), an gallium hydroxide, and an gallium halide (more preferably a fluoride or a chloride). From the viewpoint of increasing the content of the gallium element, the gallium compound more preferably contains at least one selected from the group consisting of an gallium alkoxide compound, an gallium carbide compound, an gallium hydroxide, and an gallium halide.

The composition for forming a metal-containing film according to the disclosure may contain the gallium compound singly, or in combination of two or more kinds thereof.

From the viewpoint of further improving the switching characteristics, the content of an gallium compound in a composition for forming a metal-containing film is preferably 80% by mass or more, more preferably 90% mass or more, still more preferably 99% mass or more, and especially preferably 99.9% mass or more, with respect to the total mass of the solid content of the composition for forming a metal-containing film.

[Solvent]

The composition for forming a metal-containing film according to the disclosure preferably includes a solvent.

Preferable examples of the solvent include water, a water-soluble solvent other than water, and a mixture thereof.

Examples of the water-soluble solvent include an alcohol solvent such as methanol, ethanol, 1-propanol, isopropanol, or butyl alcohol; and ethylene glycol, dimethoxyethane, dioxane, acetone, acetonitrile, cyclopentanone, tetrahydrofuran, and normal hexane. Among them, an alcohol solvent is preferable.

When a mixture of water and an alcohol solvent is used as the solvent, the mixing ratio is more preferably as follows:

water:alcohol solvent (mass ratio)=from 90:10 to 60:40.

The content of the solvent with respect to the total mass of the composition for forming a metal-containing film according to the disclosure is preferably from 10% by mass to 98% by mass, and more preferably from 50% by mass to 95% by mass.

The total amount of the solvent and the germanium compound or the total amount of the solvent and the sum of the tin compound, the indium compound, and the gallium compound, with respect to the total mass of the composition for forming a metal-containing film according to the disclosure, is preferably from 80% by mass to 100% by mass, and more preferably from 90% by mass to 100% by mass.

[Other Components]

The composition for forming a metal-containing film according to the disclosure may include other compound such as a compound including a nitrogen atom; a metal alkoxide containing a metal element other than germanium element, tin element, indium element, and gallium element; an acid; or a crosslinking agent.

Compound Including Nitrogen Atom

Examples of the compound including a nitrogen atom include an aliphatic amine; a compound having a siloxane bond (Si—O bond) and an amino group; an amine having a ring structure; and another compound including a nitrogen atom.

Here, the aliphatic amine is an aliphatic amine having a weight average molecular weight of from 10,000 to 200,000.

Examples of the aliphatic amine include polyalkyleneimine, which is a polymer of an alkyleneimine such as ethyleneimine, propyleneimine, butyleneimine, pentyleneimine, hexyleneimine, heptyleneimine, octyleneimine, trimethyleneimine, tetramethyleneimine, pentamethyleneimine, hexamethyleneimine, or octamethyleneimine; polyallylamine; and a polyacrylamide.

Examples of the compound having a siloxane bond (Si—O bond) and an amino group include a siloxane diamine, a silane coupling agent including an amino group, and a siloxane polymer.

Examples of another compound including a nitrogen atom include ammonia, an ammonium salt, ethylamine, ethanolamine, diethylamine, triethylamine, ethylenediamine, N-acetylethylenediamine, N-(2-aminoethyl)ethanolamine, and N-(2-aminoethyl)glycine.

Here, the amine having a ring structure is an amine having a ring structure with a molecular weight of from 90 to 600.

Examples of the amine having a ring structure include a cycloaliphatic amine as represented by cyclohexylamine and N-methylcyclohexylamine; an aromatic amine as represented by diaminodiphenyl ether, xylenediamine (preferably paraxylenediamine), diaminobenzene, diaminotoluene, methylenedianiline, dimethyldiaminobiphenyl, bis(trifluoromethyl)diaminobiphenyl, diaminobenzophenone, diaminobenzanilide, bis(aminophenyl)fluorene, bis(aminophenoxy)benzene, bis(aminophenoxy)biphenyl, dicarboxy diaminodiphenylmethane, diaminoresorcin, dihydroxybenzidine, diaminobenzidine, 1,3,5-triaminophenoxybenzene, 2,2'-dimethylbenzidine, tris(4-aminophenyl)amine, 2,7-diaminofluorene, 1,9-diaminofluorene, and dibenzylamine; and a heterocyclic amine as represented by melamine, ammeline, melam, and melem.

Metal Alkoxide Containing Metal Element Other Than Germanium Element, Tin Element, Indium Element, and Gallium Element Examples of the metal alkoxide containing a metal element other than germanium element, tin element, indium element, and gallium element include a metal alkoxide represented by Formula (I).

(where $R^1$ represents a non-hydrolyzable group; $R^2$ represents an alkyl group having from 1 to 6 carbon atoms; M represents at least one metal atom selected from the metal atom group consisting of Ti, Al, Zr, Sr, Ba, Zn, B, Y, Pb, P, Sb, V, Ta, W, La, Nd, and Hf; m is the valence of the metal atom M, which is 3 or 4; n is an integer from 0 to 2 when m is 4, or 0 or 1 when m is 3; when there are plural $R^1$s, each $R^1$ may be the same as or different from one another; and when there are plural $OR^2$s, each $OR^2$ may be the same as or different from one another.)

In Formula (I), n is preferably 1 or more.

Acid

Examples of the acid include an acid having a molecular weight of from 46 to 195.

In a case in which the composition for forming a metal-containing film according to the disclosure includes, for example, the compound containing a nitrogen atom and the acid, it is presumed that an ionic bond between a carboxy group in the acid and an amino group in the compound containing a nitrogen atom is formed, thereby suppressing the aggregation caused by the association between the compound containing a nitrogen atom and the acid.

The acid is preferably a carboxylic acid compound that includes a carboxy group and has a weight average molecular weight of from 46 to 195. The carboxylic acid compound is not particularly limited, and examples thereof include a monocarboxylic acid compound, a dicarboxylic acid compound, and an oxydicarboxylic acid compound. More specific examples of the acid include formic acid, acetic acid, malonic acid, oxalic acid, citric acid, benzoic acid, lactic acid, glycolic acid, glyceric acid, butyric acid, methoxyacetic acid, ethoxyacetic acid, phthalic acid, terephthalic acid, picolinic acid, salicylic acid, and 3,4,5-trihydroxybenzoic acid.

Crosslinking Agent

Preferable examples of the crosslinking agent include a compound including 3 or more —C(=O)OX groups (wherein X represents a hydrogen atom or an alkyl group having from 1 to 6 carbon atoms) in the molecule, in which from 1 to 6 of the 3 or more —C(=O)OX groups (hereinafter, also referred to as "COOX") are —C(=O)OH groups (hereinafter, also referred to as "COOH"), and having a weight average molecular weight of from 200 to 600.

Specific examples of the crosslinking agent include, but are not particularly limited to: an alicyclic carboxylic acid such as 1,2,3,4-cyclobutanetetracarboxylic acid, 1,2,3,4-cyclopentanetetracarboxylic acid, 1,3,5-cyclohexanetricarboxylic acid, 1,2,4-cyclohexanetricarboxylic acid, 1,2,4,5-cyclohexanetetracarboxylic acid, or 1,2,3,4,5,6-cyclohexanehexacarboxylic acid; a benzenecarboxylic acid such as 1,2,4-benzenetricarboxylic acid, 1,3,5-benzenetricarboxylic acid, pyromellitic acid, benzenepentacarboxylic acid, or mellitic acid; a naphthalenecarboxylic acid such as 1,4,5,8-naphthalenetetracarboxylic acid, or 2,3,6,7-naphthalenetetracarboxylic acid; a diphthalic acid such as 3,3',5,5'-tetracarboxydiphenylmethane, biphenyl-3,3',5,5'-tetracarboxylic acid, biphenyl-3,4',5-tricarboxylic acid, biphenyl-3, 3',4,4'-tetracarboxylic acid, benzophenone-3,3,4,4'-tetracarboxylic acid, 4,4'-oxydiphthalic acid, or 1,3-bis (phthalic acid)tetramethyldisiloxane; a fluorinated aromatic ring carboxylic acid such as 4,4'-(hexafluoroisopropylidene) diphthalic acid, 9,9-bis(trifluoromethyl)-9H-xanthene-2,3,6, 7-tetracarboxylic acid, or 1,4-ditrifluoromethylpyromellitic acid; and an ester thereof.

From the viewpoint of further improving the switching characteristics, the content of another compound in the composition for forming a metal-containing film according to the disclosure is preferably 10% by mass or less, more preferably 5% by mass or less, and still more preferably 1% by mass or less, with respect to the total mass of the solid content of the composition for forming a metal-containing film.

The composition for forming a metal-containing film according to the disclosure may include phthalic acid, benzoic acid, or a derivative thereof as another compound, for example, to improve electrical characteristics.

The composition for forming a metal-containing film according to the disclosure may contain benzotriazole or a derivative thereof as another compound, for example, to suppress copper corrosion.

<Physical Properties of Composition for Forming Metal-Containing Film>

The composition for forming a metal-containing film according to the disclosure preferably has an onset temperature for curing of 300° C. or lower, more preferably 250° C. or lower, and still more preferably 200° C. or lower.

In the disclosure, the onset temperature for curing means a rising temperature of the storage elastic modulus. The storage elastic modulus at each temperature can be continuously measured by a dynamic viscoelasticity measuring device.

[Refractive Index]

From the viewpoint of improving the switching characteristics, the composition for forming a metal-containing film according to the disclosure preferably has a refractive index of from 1.30 to 2.00, more preferably from 1.40 to 1.90, and still more preferably from 1.50 to 1.80, after firing at 400° C. for 10 minutes under a nitrogen atmosphere.

Specifically, the composition for forming a metal-containing film according to the disclosure is preferably a composition for forming a metal-containing film in which, when a fired product is obtained by firing the composition at 400° C. for 10 minutes under a nitrogen atmosphere, the fired product has a refractive index within the above-described range.

—Method of Measuring Refractive Index—

The refractive index is measured by the following method.

A composition for forming a metal-containing film is applied onto a silicon substrate (e.g., a silicon flat plate) and fired at 400° C. for 10 minutes under a nitrogen atmosphere.

The silicon substrate on which the metal-containing film is formed is cut into a 2 cm square to prepare a sample, which is then set in a sample chamber of an optical porosimeter (model: PS-1200) manufactured by Semilab Inc. and subjected to the measurement.

The refractive index is obtained using a single layer containing each metal element and a Cauchy model, which assumes no absorption, as an analysis model. When estimating each film thickness, the thickness is calculated by a single-layer analysis. At this time, in order to improve the film fitting accuracy, the analysis is performed by adding a +Lorentz term to the Cauchy's formula.

[pH]

The pH at 25° C. of the composition for forming a metal-containing film according to the disclosure is not particularly limited, and is preferably from 2.0 to 12.0.

(Method of Producing Composition for Forming Metal-Containing Film)

The method of producing the composition for forming a metal-containing film according to the disclosure preferably includes a mixing step of mixing a solvent with a germanium compound or at least one selected from the group consisting of a tin compound, an indium compound, and a gallium compound.

When the composition for forming a metal-containing film contains a germanium compound or at least one selected from the group consisting of a tin compound, an indium compound, and a gallium compound, and an ingredient other than a solvent, all components may be mixed together, or some components may be mixed in advance and then other components may be further added and mixed. In other words, the timing for adding each component of the composition for forming a metal-containing film is not particularly limited.

EXAMPLES

The disclosure will be specifically described below by way of Examples, but the disclosure is not limited thereto.

In the following, as water, ultrapure water (Milli-Q water manufactured by Millipore Corporation, resistance of 18 MΩ·cm (25° C. or less)) was used.

Example 1

<Preparation of Composition A1 for Forming Metal-Containing Film>

0.34 parts by mass of germanium ethoxide (manufactured by Gelest, Inc.) was dissolved in 3.7 parts by mass of 1-propanol (manufactured by FUJIFILM Wako Pure Chemical Corporation) and stirred for 1 hour, thereby preparing a composition A1 for forming a metal-containing film.

<Production of Metal-Containing Film>

A silicon substrate (a dummy substrate manufactured by Shin-Etsu Chemical Co., Ltd.) was prepared as a substrate on which the composition A1 for forming a metal-containing film is to be applied. To the silicon substrate placed on a spin coater with humidity in a chamber kept below 30% RH, the composition A1 for forming a metal-containing film was added dropwise at 30% humidity, and held for 30 seconds. Then the substrate was rotated at 600 rpm (rpm is the number of rotations per minute) for 30 seconds and further rotated at 2,000 rpm for 10 seconds for drying. Subsequently, the substrate was dried at 240° C. for 1 minute. The dried composition A1 for forming a metal-containing film was then heated (i.e., fired) at 400° C. for 10 minutes under a nitrogen atmosphere (30 kPa), thereby producing a metal-containing film having a thickness of 200 nm.

Example 2

<Production of Metal-Containing Film>

A metal-containing film containing germanium element was formed to a thickness of 200 nm on a silicon substrate (a dummy substrate manufactured by Shin-Etsu Chemical Co., Ltd.) by sputtering using a $GeO_2$ target.

Example 3

<Preparation of Composition A2 for Forming Metal-Containing Film>

To 75.3 parts by mass of water, 6.5 parts by mass of 28% aqueous ammonia (manufactured by FUJIFILM Wako Pure Chemical Corporation) was added, and further 18.2 parts by mass of carboxyethyl germanium sesquioxide (BCGe) (manufactured by Tokyo Chemical Industry Co., Ltd., product number: B1367) was added and mixed uniformly, thereby preparing a composition A2 for forming a metal-containing film.

<Production of Metal-containing Film>

A silicon substrate (a dummy substrate manufactured by Shin-Etsu Chemical Co., Ltd.) was prepared as a substrate on which the composition A2 for forming a metal-containing film is to be applied. To the silicon substrate placed on a spin coater, 1.0 mL of the composition for forming a metal-containing film A2 was dropped at a fixed speed for 10 seconds, and held for 13 seconds. Then the substrate was rotated at 2,000 rpm for 1 second, at 600 rpm for 30 seconds, and further rotated at 2,000 rpm for 10 seconds for drying.

Subsequently, the substrate was dried at 100° C. for 1 minute, and the metal-containing film was then heated at 300° C. for 10 minutes under a nitrogen atmosphere (30 kPa). The metal-containing film was then further heated at 400° C. for 10 minutes (i.e., the same sample was continuously processed).

The thickness of the obtained metal-containing film was 200 nm.

Comparative Example 1

<Preparation of Comparative Composition 1 for Forming Metal-Containing Film>

To 18.23 parts by mass of carboxyethyl germanium sesquioxide (BCGe) (manufactured by Tokyo Chemical Industry Co., Ltd., product number: B1367), 3.83 parts by mass of ethylamine (EA) and 77.94 parts by mass of water were added, thereby obtaining a BCGe solution.

10.0 parts by mass of paraxylenediamine (pXDA) (manufactured by Aldrich Co., Ltd.), 50.0 parts by mass of water, and 40.0 parts by mass of 1-propanol (manufactured by KANTO CHEMICAL CO., INC.) were mixed, thereby obtaining a pXDA solution.

30 parts by mass of BCGe solution, 40 parts by mass of pXDA solution, and 30 parts by mass of water were mixed, thereby obtaining a solution of 5.47% by mass of BCGe, 4.00% by mass of pXDA, and 1.15% by mass of EA. This solution was used as a comparative composition 1 for forming a metal-containing film of Comparative Example 1.

<Production of Metal-Containing Film>

A metal-containing film was produced in the same manner as in Example 3.

Comparative Example 2

<Preparation of Comparative Composition 2 for Forming Metal-containing Film>

A round-bottomed glass flask was charged with 35.55 parts by mass of acetone and 35.55 parts by mass of acetylacetone. To the flask, 18.6 parts by mass of tetraisobutoxytitanium (i.e., metal alkoxide), 3.24 parts by mass of triethoxyvinylsilane (i.e., metal alkoxide), and 0.74 parts by mass of triethoxymethylsilane (i.e., metal alkoxide) were added, and mixing and stirring. 5.21 parts by mass of 0.01 N HCl was then prepared, and added dropwise thereto over 10 minutes and mixed. The mixture was stirred and mixed at 85° C. for 3 hours using an oil bath. The flask was taken out from the oil bath, cooled to room temperature, and charged with 48.0 parts by mass of acetylacetone. The residue after heating at 150° C. under a $N_2$ atmosphere was obtained as a polymer, and a solvent was distilled off under reduced pressure until the polymer concentration reached 60%, thereby removing the solvent, water, and a by-product.

The resultant was regarded as a polymer concentrate produced from the above-described three metal alkoxides.

A mixed solution of acetylacetone/1-methoxy-2-propanol (mass ratio)=10/90 was added to 12.18 parts by mass of the polymer concentrate, thereby obtaining a 15% polymer solution.

Then, 12.81 parts by mass of the polymer solution was added to a mixed solution of 1.31 parts by mass of acetylacetone, 24.8 parts by mass of 1-ethoxy-2-propanol, 4.8 parts by mass of 1-methoxy-2-propanol, and 6.2 parts by mass of water, and then 0.0192 parts by mass of maleic acid and 0.0115 parts by mass of benzyltriethylammonium chloride were added, thereby preparing a polymer 4% by mass solution, which was used as a comparative composition 2 for forming a metal-containing film of the comparative example.

<Production of Metal-containing Film>

A metal-containing film was produced in the same manner as in Example 3 except that the comparative composition 2 for forming a metal-containing film was used instead of the composition A2 for forming a metal-containing film.

Comparative Example 3

<Production of Metal-Containing Film>

A metal-containing film having a thickness of 200 nm was formed on a silicon substrate (a dummy substrate manufactured by Shin-Etsu Chemical Co., Ltd.) by sputtering using an $Al_2O_3$ target.

Comparative Example 4

<Production of Metal-Containing Film>

A metal-containing film having a thickness of 200 nm was formed on a silicon substrate (a dummy substrate manufactured by Shin-Etsu Chemical Co., Ltd.) by sputtering using a $ZrO_2$ target.

(Measurement of Content of Germanium Element)

Using the metal-containing film obtained in each of Examples and Comparative Examples, the contents of germanium element and other elements were measured by X-ray electron spectroscopy under the above-described conditions.

The measurement results are shown in Table 1 below.

(Measurement of Refractive Index)

With respect to the metal-containing film obtained in each of Examples and Comparative Examples, the refractive index of the metal-containing film was measured with a porosimeter (PS-1200) under the above-described conditions.

The measurement results are shown in Table 1 below.

(Evaluation of Switching Characteristics)

Plasma etching treatment was performed on the metal-containing film formed in each of Examples and Comparative Examples using an RIE1515Z parallel-plate plasma treatment apparatus manufactured by ULVAC, Inc.

The metal-containing film obtained in each example was placed in a chamber, the pressure in the chamber was reduced to 1 Pa or less, and then $Cl_2$ gas was introduced at 30 ml/min as an etching gas, thereby setting the pressure in the chamber to 7 Pa.

Subsequently, plasma discharge was performed by applying 13.56 MHz high-frequency power, and plasma treatment was performed for 30 seconds.

Next, plasma treatment was performed in the same manner as described above using $CF_4$ gas instead of $Cl_2$ gas as an etching gas.

The plasma treatment time was 60 seconds when any gas was used.

As a control example, a sample in which a spin-on carbon film (SOC film, carbon content: 81.9 atm %) having a thickness of 200 nm was formed on a silicon substrate was prepared, and plasma treatment was performed using $Cl_2$ gas or $CF_4$ gas.

As the SOC relative etching rate (no unit), the value obtained by dividing the etching rate (nm/s) of the metal-containing film produced by each of Examples or Comparative Examples by the etching rate (nm/s) of the SOC film (i.e., the etching rate of the metal-containing film/the etching rate of the SOC film) is shown in Table 2.

Further, a sample in which an amorphous silicon film (a-Si film) having a thickness of 200 nm was formed on a silicon substrate was prepared, and plasma treatment was performed using $Cl_2$ gas or $CF_4$ gas.

As the a-Si relative etching rate (no unit), the value obtained by dividing the etching rate (nm/s) of the metal-containing film produced in Example 2 by the etching rate of the a-Si film (nm/s) (i.e., the etching rate of the metal-containing film/the etching rate of the a-Si film) is shown in Table 2.

TABLE 2

| | SOC relative etching rate | | a-Si relative etching rate | |
|---|---|---|---|---|
| | $Cl_2$ gas | $CF_4$ gas | $Cl_2$ gas | $CF_4$ gas |
| Example 1 | 0.1 | 2.3 | — | — |
| Example 2 | 0.1 | 2.3 | 0.4 | 2.4 |
| Example 3 | 1.0 | 2.6 | — | — |
| Comparative Example 1 | 1.5 | 1.6 | — | — |

TABLE 1

| | C (atm %) | O (atm %) | N (atm %) | Si (atm %) | Ge (atm %) | Ti (atm %) | Al (atm %) | Zr (atm %) | Sn (atm %) | Refractive index |
|---|---|---|---|---|---|---|---|---|---|---|
| Example 1 | 3.8 | 62.5 | 0 | 0 | 32.7 | 0 | 0 | 0 | 0 | 1.53 |
| Example 2 | 7.7 | 58.6 | 0 | 0.3 | 33.3 | 0 | 0 | 0 | 0 | 1.64 |
| Example 3 | 39.1 | 40.5 | 0 | 0 | 20 | 0 | 0 | 0 | 0 | 1.71 |
| Comparative Example 1 | 45.9 | 31.7 | 5.9 | 0 | 16.5 | 0 | 0 | 0 | 0 | 1.67 |
| Comparative Example 2 | 21.6 | 49.6 | 0 | 11.3 | 0 | 16.4 | 0 | 0 | 0 | 1.78 |
| Comparative Example 3 | 19.1 | 46.1 | 0.5 | 0 | 0 | 0 | 34.3 | 0 | 0 | 1.65 |
| Comparative Example 4 | 0 | 66 | 0 | 0 | 0 | 0 | 0 | 33 | 0 | 2.18 |

TABLE 2-continued

| | SOC relative etching rate | | a-Si relative etching rate | |
|---|---|---|---|---|
| | $Cl_2$ gas | $CF_4$ gas | $Cl_2$ gas | $CF_4$ gas |
| Comparative Example 2 | −0.1 | 0.3 | — | — |
| Comparative Example 3 | <0.1 | <0.1 | — | — |
| Comparative Example 4 | <0.1 | <0.1 | — | — |

Each of the metal-containing films formed in Examples 1 to 3 was solid at 400° C. under an atmosphere of 1 atm.

Furthermore, the composition A1 for forming a metal-containing film and the composition A2 for forming a metal-containing film used in Example 1 or Example 3 had an onset temperature for curing of 200° C. or lower.

The solid state of the film as described above and the onset temperature for curing were determined by the methods described above.

In Table 2, "<0.1" in the SOC relative etching rate column indicates that the SOC relative etching rate was less than 0.1. An example in which the SOC relative etching rate was a negative value means that a substance was adversely attached and the thickness was increased in the plasma treatment. In other words, the film was not etched.

From the results shown in Table 2, as a result, in each of Examples 1 to 3 in which the content of germanium element was 20 atm % or more, the SOC relative etching rate with respect to $Cl_2$ gas was 1 or less, while the relative etching rate with respect to $CF_4$ gas exceeded 1, suggesting that the film had switching characteristics.

In Example 2, the a-Si relative etching rate with respect to $Cl_2$ gas was 1 or less, while the relative etching rate with respect to $CF_4$ gas exceeds 1, suggesting that the film had switching characteristics.

In Comparative Example 1 (Ge content of 16.5 atm %), the SOC etching rate exceeded 1 whether $Cl_2$ gas or $CF_4$ gas was used, suggesting that the film did not have switching characteristics.

In each of Comparative Examples 2 to 4, the SOC etching rate was less than 0.5 whether $Cl_2$ gas or $CF_4$ gas was used, suggesting that the film did not have switching characteristics.

Example 4

<Production of Metal-containing Film>

A metal-containing film containing tin element was formed to a thickness of 200 nm on a silicon substrate (a dummy substrate manufactured by Shin-Etsu Chemical Co., Ltd.) by sputtering using a $SnO_2$ target.

Example 5

<Preparation of Composition B1 for Forming Metal-containing Film>

47.2 parts by mass of water was added to 0.08 parts by mass of polyvinyl alcohol (Mw=22,000) (manufactured by FUJIFILM Wako Pure Chemical Corporation), and the mixture was heated to 70° C. and dissolved by stirring for 1 hour. Furthermore, 52.7 parts by mass of a 15% by mass-$SnO_2$ colloidal dispersion (manufactured by Alfa Aeser) was added thereto, and the mixture was stirred for 1 hour and then allowed to stand for 23 hours, thereby obtaining a composition B1 for forming a metal-containing film.

<Production of Metal-Containing Film>

A silicon substrate (a dummy substrate manufactured by Shin-Etsu Chemical Co., Ltd.) was prepared as a substrate on which the composition B1 for forming a metal-containing film is to be applied. To the silicon substrate placed on a spin coater with humidity in chamber kept below 30% RH, 0.5 mL of the composition B1 for forming a metal-containing film was added dropwise at 30% humidity, and held for 30 seconds. Then the substrate was rotated at 600 rpm (rpm is the number of rotations per minute) for 30 seconds and further rotated at 2,000 rpm for 10 seconds for drying. Subsequently, the substrate was dried at 100° C. for 1 minute. The dried composition B1 for forming a metal-containing film was then heated (i.e., fired) at 230° C. for 10 minutes under a nitrogen atmosphere (100 kPa), thereby producing a metal-containing film having a thickness of 200 nm.

Example 6

49.75 parts by mass of water was added to 0.25 parts by mass of polyvinyl alcohol (Mw=22,000) (manufactured by FUJIFILM Wako Pure Chemical Corporation), and the mixture was heated to 70° C. and dissolved by stirring for 1 hour. Furthermore, 50.0 parts by mass of a 15% by mass-$SnO_2$ colloidal dispersion (manufactured by Alfa Aeser) was added thereto, and the mixture was stirred for 1 hour and then allowed to stand for 23 hours, thereby obtaining a clear composition B2 for forming a metal-containing film.

A metal-containing film was produced in the same manner as in Example 5 using the composition B2 for forming a metal-containing film.

Example 7

A metal-containing film was produced in the same manner as in Example 5 except that 15% by mass-$SnO_2$ colloidal dispersion (manufactured by Alfa Aeser) (also referred to as "composition B3 for forming a metal-containing film") was used instead of the composition B1 for forming a metal-containing film in Example 5 and that the heating (firing) temperature was set to 400° C.

Example 8

A metal-containing film was produced in the same manner as in Example 5 except that the heating (firing) temperature was set to 400° C.

Example 9

A metal-containing film was produced in the same manner as in Example 6 except that the heating (firing) temperature was set to 400° C.

Example 10

<Preparation of Composition B4 for Forming Metal-Containing Film>

46.3 parts by mass of water was added to 1.2 parts by mass of polyvinyl alcohol (Mw=22,000) (manufactured by FUJIFILM Wako Pure Chemical Corporation), and the mixture was heated to 70° C. and dissolved by stirring for 1 hour. Furthermore, 46.7 parts by mass of a 15% by mass-$SnO_2$ colloidal dispersion (manufactured by Alfa Aeser) was added thereto, and the mixture was stirred for 1 hour and then allowed to stand for 23 hours, thereby obtain a clear composition B4 for forming a metal-containing film.

A metal-containing film was produced in the same manner as in Example 5 using the composition B4 for forming a metal-containing film.

Example 11

24.0 parts by mass of water was added to 1.3 parts by mass of polyvinyl alcohol (Mw=22,000) (manufactured by FUJIFILM Wako Pure Chemical Corporation), and the mixture was heated to 70° C. and dissolved by stirring for 1 hour. Furthermore, 76.0 parts by mass of a 15% by mass-$SnO_2$ colloidal dispersion (manufactured by Alfa Aeser) was added thereto, and the mixture was stirred for 1 hour and then allowed to stand for 23 hours, thereby obtaining a clear composition B5 for forming a metal-containing film.

A metal-containing film was produced in the same manner as in Example 5 using the composition B5 for forming a metal-containing film.

Example 12

<Preparation of Composition B6 for Forming Metal-Containing Film>

66.0 parts by mass of water was added to 0.7 parts by mass of polyvinyl alcohol (Mw=22,000) (manufactured by FUJIFILM Wako Pure Chemical Corporation), and the mixture was heated to 70° C. and dissolved by stirring for 1 hour. Furthermore, 34.0 parts by mass of a 15% by mass-$SnO_2$ colloidal dispersion (manufactured by Alfa Aeser) was added thereto, and the mixture was stirred for 1 hour and then allowed to stand for 23 hours, thereby obtaining a clear composition B6 for forming a metal-containing film.

A metal-containing film was produced in the same manner as in Example 5 using the composition B6 for forming a metal-containing film.

Example 13

25.3 parts by mass of water was added to 2.2 parts by mass of polyvinyl alcohol (Mw=22,000) (manufactured by FUJIFILM Wako Pure Chemical Corporation), and the mixture was heated to 70° C. and dissolved by stirring for 1 hour. Furthermore, 74.7 parts by mass of a 15% by mass-$SnO_2$ colloidal dispersion (manufactured by Alfa Aeser) was added thereto, and the mixture was stirred for 1 hour, and then allowed to stand for 23 hours, thereby obtaining a clear composition B7 for forming a metal-containing film.

A metal-containing film was produced in the same manner as in Example 5 using the composition B7 for forming a metal-containing film.

Example 14

24.7 parts by mass of water was added to 3.2 parts by mass of polyvinyl alcohol (Mw=22,000) (manufactured by FUJIFILM Wako Pure Chemical Corporation), and the mixture was heated to 70° C. and dissolved by stirring for 1 hour. Furthermore, 75.3 parts by mass of a 15% by mass-$SnO_2$ colloidal dispersion (manufactured by Alfa Aeser) was added thereto, and the mixture was stirred for 1 hour and then allowed to stand for 23 hours, thereby obtaining a clear composition B8 for forming a metal-containing film.

A metal-containing film was produced in the same manner as in Example 5 using the composition B8 for forming a metal-containing film.

Example 15

30.0 parts by mass of water was added to 3.7 parts by mass of polyvinyl alcohol (Mw=22,000) (manufactured by FUJIFILM Wako Pure Chemical Corporation), and the mixture was heated to 70° C. and dissolved by stirring for 1 hour. Furthermore, 70.0 parts by mass of a 15% by mass-$SnO_2$ colloidal dispersion (manufactured by Alfa Aeser) was added thereto, and the mixture was stirred for 1 hour, and then allowed to stand for 23 hours, thereby obtaining a clear composition B9 for forming a metal-containing film.

A metal-containing film was produced in the same manner as in Example 5 using the composition B9 for forming a metal-containing film.

Example 16

57.3 parts by mass of water was added to 6.2 parts by mass of polyvinyl alcohol (Mw=22,000) (manufactured by FUJIFILM Wako Pure Chemical Corporation), and the mixture was heated to 70° C. and dissolved by stirring for 1 hour. Furthermore, 42.7 parts by mass of a 15% by mass-$SnO_2$ colloidal dispersion (manufactured by Alfa Aeser) was added thereto, and the mixture was stirred for 1 hour and then allowed to stand for 23 hours, thereby obtaining a clear composition B10 for forming a metal-containing film.

A metal-containing film was produced in the same manner as in Example 5 using the composition B10 for forming a metal-containing film.

Example 17

56.7 parts by mass of water was added to 10.0 parts by mass of polyvinyl alcohol (Mw=22,000) (manufactured by FUJIFILM Wako Pure Chemical Corporation), and the mixture was heated to 70° C. and dissolved by stirring for 1 hour. Furthermore, 43.3 parts by mass of a 15% by mass-$SnO_2$ colloidal dispersion (manufactured by Alfa Aeser) was added thereto, and the mixture was stirred for 1 hour and then allowed to stand for 23 hours, thereby obtaining a clear composition B11 for forming a metal-containing film.

A metal-containing film was produced in the same manner as in Example 5 using the composition B11 for forming a metal-containing film.

Comparative Example 5

96.0 parts by mass of ethanol was added to 4.0 parts by mass of polyoxyethylene-polyoxypropylene block polymer (Epan 410) (Mw=1200, hydrophilic group: 10%) (manufactured by DKS Co. Ltd.), and the mixture was dissolved by stirring for 1 hour. The mixture was then allowed to stand for 23 hours, thereby obtaining a comparative composition 3.

A metal-free film was produced in the same manner as in Example 5 using the comparative composition 3.

Comparative Example 6

95.4 parts by mass of ethanol was added to 0.6 parts by mass of stannous chloride dihydrate (manufactured by FUJIFILM Wako Pure Chemical Corporation), and the mixture was dissolved by stirring for 24 hours. Further, 4.0 parts by mass of polyoxyethylene-polyoxypropylene block polymer (Epan 410) (Mw=1200, hydrophilic group: 10%) (manufactured by DKS Co. Ltd.) was added thereto, and the mixture was stirred for 1 hour and then allowed to stand for 23 hours, thereby obtaining a comparative composition 4 for forming a metal-containing film.

A metal-containing film was produced in the same manner as in Example 5 using the comparative composition 4 for forming a metal-containing film.

Comparative Example 7

95.33 parts by mass of ethanol was added to 0.54 parts by mass of stannous chloride dihydrate (manufactured by FUJI-FILM Wako Pure Chemical Corporation), and the mixture was dissolved by stirring for 24 hours. Further, 4.13 parts by mass of polyoxyethylene-polyoxypropylene block polymer (Epan 420) (Mw=1200, hydrophilic group: 20%) (manufactured by DKS Co. Ltd.) was added thereto, and the mixture was stirred for 1 hour and then allowed to stand for 23 hours, thereby obtaining a comparative composition 5 for forming a metal-containing film.

A metal-containing film was produced in the same manner as in Example 5 using the comparative composition 5 for forming a metal-containing film.

Comparative Example 8

<Production of Metal-Containing Film>

A metal-containing film was formed to a thickness of 200 nm on a silicon substrate (a dummy substrate manufactured by Shin-Etsu Chemical Co., Ltd.) by sputtering using an $Al_2O_3$ target.

Here, Comparative Example 8 is the same example as Comparative Example 3 described above.

Comparative Example 9

<Production of Metal-Containing Film>

A metal-containing film was formed to a thickness of 200 nm on a silicon substrate (a dummy substrate manufactured by Shin-Etsu Chemical Co., Ltd.) by sputtering using a $TiO_2$ target.

Comparative Example 10

<Production of Metal-containing Film>

A metal-containing film was formed to a thickness of 200 nm on a silicon substrate (a dummy substrate manufactured by Shin-Etsu Chemical Co., Ltd.) by sputtering using a $ZrO_2$ target.

Here, Comparative Example 10 is the same example as Comparative Example 4 described above.

Reference Example 1

<Production of Metal-Containing Film>

A metal-containing film was formed to a thickness of 200 nm on a silicon substrate (a dummy substrate manufactured by Shin-Etsu Chemical Co., Ltd.) by sputtering using a $GeO_2$ target.

Here, Reference Example 1 is the same example as Example 2 described above.

(Measurement of Content of Metal Element)

Using the metal-containing film obtained in each of Examples and Comparative Examples, the contents of metal elements and other elements were measured by X-ray electron spectroscopy under the above-described conditions.

The measurement results are shown in Table 3 below.

(Measurement of Refractive Index)

Using the metal-containing film obtained in each of Examples and Comparative Examples, the refractive index of the metal-containing film was measured with a porosimeter (PS-1200) under the above-described conditions.

The measurement results are shown in Table 3 below.

TABLE 3

| | C (atm %) | O (atm %) | N (atm %) | Si (atm %) | Ge (atm %) | Ti (atm %) | Al (atm %) | Zr (atm %) | Sn (atm %) | K (atm %) | Cl (atm %) | Refractive index |
|---|---|---|---|---|---|---|---|---|---|---|---|---|
| Example 4 | 27.1 | 45.3 | 1.4 | 0 | 0 | 0 | 0 | 0 | 26.2 | 0 | 0 | 2.003 |
| Example 5 | 22.6 | 49.1 | 0.3 | 2.1 | 0 | 0 | 0 | 0 | 22.6 | 3.1 | 0.2 | 1.672 |
| Example 6 | 15.1 | 52.9 | 0.5 | 3.1 | 0 | 0 | 0 | 0 | 25.1 | 3.2 | 0.1 | 1.681 |
| Example 7 | 2.9 | 61.2 | 0 | 3.4 | 0 | 0 | 0 | 0 | 28.8 | 3.7 | 0 | 1.570 |
| Example 8 | 21.1 | 49.6 | 0.4 | 2.3 | 0 | 0 | 0 | 0 | 23.2 | 3.2 | 0.2 | 1.681 |
| Example 9 | 9.8 | 55.8 | 0.3 | 3 | 0 | 0 | 0 | 0 | 27.2 | 3.6 | 0.3 | 1.687 |
| Example 10 | 26.3 | 41.9 | 7.6 | 0 | 0 | 0 | 0 | 0 | 21.4 | 2.8 | 0 | 1.642 |
| Example 11 | 31.4 | 37.8 | 8.5 | 0.6 | 0 | 0 | 0 | 0 | 19.1 | 2.2 | 0.4 | 1.681 |
| Example 12 | 35.0 | 34.3 | 11.4 | 0 | 0 | 0 | 0 | 0 | 16.7 | 2.6 | 0 | 1.666 |
| Example 13 | 41.4 | 29.4 | 12.4 | 0.2 | 0 | 0 | 0 | 0 | 14.3 | 2.0 | 0.3 | 1.667 |
| Example 14 | 46.5 | 24.0 | 15.6 | 0.4 | 0 | 0 | 0 | 0 | 11.2 | 1.9 | 0.4 | 1.612 |
| Example 15 | 52.6 | 17.8 | 19.5 | 0.1 | 0 | 0 | 0 | 0 | 8.2 | 1.5 | 0.3 | 1.661 |
| Example 16 | 60.4 | 10.2 | 23.6 | 0 | 0 | 0 | 0 | 0 | 5.1 | 0.5 | 0.2 | 1.587 |
| Example 17 | 66.8 | 4.3 | 26.7 | 0 | 0 | 0 | 0 | 0 | 2.0 | 0.1 | 0.1 | 1.575 |
| Comparative Example 5 | 76.5 | 23.5 | 0 | 0 | 0 | 0 | 0 | 0 | 0 | 0 | 0 | 1.456 |
| Comparative Example 6 | 75.7 | 23.6 | 0 | 0 | 0 | 0 | 0 | 0 | 0.5 | 0 | 0.2 | 1.466 |
| Comparative Example 7 | 76 | 23.7 | 0 | 0 | 0 | 0 | 0 | 0 | 0.2 | 0 | 0.1 | 1.466 |
| Comparative Example 8 | 19 | 46.1 | 0.5 | 0 | 0 | 0 | 34.3 | 0 | 0 | 0 | 0 | 1.661 |
| Comparative Example 9 | 27.5 | 47.4 | 1.2 | 0.7 | 0 | 23.2 | 0 | 0 | 0 | 0 | 0 | 2.429 |
| Comparative Example 10 | 25 | 48.3 | 0 | 0 | 0 | 0 | 0 | 26.1 | 0 | 0 | 0 | 2.186 |
| Reference Example 1 | 7.7 | 58.6 | 0 | 0.3 | 33.3 | 0 | 0 | 0 | 0 | 0 | 0 | 1.635 |

(Evaluation of Switching Characteristics)

Plasma etching was performed on the metal-containing film formed in each of Examples and Comparative Examples using an RIE1515Z parallel-plate plasma treatment apparatus manufactured by ULVAC, Inc.

The metal-containing film obtained in each example was placed in a chamber. The pressure in the chamber was reduced to 1 Pa or less, and $CF_4$ gas was introduced at 30 ml/min as an etching gas, thereby setting the pressure in the chamber to 7 Pa.

Subsequently, plasma discharge was performed by applying 13.56 MHz high-frequency power having a power density of 1.8 W/cm', and plasma treatment was performed for 30 seconds.

Further, as a control example, monosilane and ammonia gas were introduced and mixed in a vacuum chamber, and a silicon nitride film (i.e., $SiN_x$ film) was formed to a thickness of 500 nm on a heated silicon substrate using a plasma CVD method. The plasma treatment was then performed using $CF_4$ gas or $Cl_2$/Ar gas under the same conditions as Examples and Comparative Examples.

As the $SiN_x$ relative etching rate (no unit), the value obtained by dividing the etching rate (nm/s) of each of the metal-containing films produced in Examples 5 and 11 to 14 by the etching rate (nm/s) of the $SiN_x$ film which is the reference example (i.e., the etching rate of the metal-containing film/the etching rate of the $SiN_x$ film) is shown in Table 4.

TABLE 4

| | Metallic element | | Firing temperature (° C.) | $SiO_2$ relative etching rate | | $SiN_x$ relative etching rate | |
|---|---|---|---|---|---|---|---|
| | Metal species | Content (atm %) | | $CF_4$ gas | $Cl_2$/Ar gas | $CF_4$ gas | $Cl_2$/Ar gas |
| Example 4 | Sn | 26.2 | — | 0.05 | 6.64 | — | — |
| Example 5 | Sn | 22.6 | 230 | −0.02 | 4.71 | −0.01 | 3.95 |
| Example 6 | Sn | 25.1 | 230 | 0 | 3.78 | — | — |
| Example 7 | Sn | 27.6 | 400 | 0.15 | 7.39 | — | — |
| Example 8 | Sn | 23.2 | 400 | −0.02 | 4.96 | — | — |
| Example 9 | Sn | 27.2 | 400 | 0.05 | 3.85 | — | — |
| Example 10 | Sn | 21.4 | 230 | 0.03 | 7.2 | — | — |
| Example 11 | Sn | 19.1 | 230 | −0.10 | 13.5 | −0.02 | 11.3 |
| Example 12 | Sn | 16.7 | 230 | 0.42 | 15.5 | 0.09 | 13.0 |
| Example 13 | Sn | 14.3 | 230 | 0.50 | 21.1 | 0.11 | 17.7 |
| Example 14 | Sn | 11.2 | 230 | 0.23 | 16.3 | 0.05 | 13.7 |
| Example 15 | Sn | 8.2 | 230 | 0.39 | 7.6 | — | — |
| Example 16 | Sn | 5.1 | 230 | 0.24 | 20.4 | — | — |
| Example 17 | Sn | 2.0 | 230 | 0.55 | 24.3 | — | — |
| Comparative Example 5 | Sn | 0 | 230 | 5.4 | 156.1 | — | — |
| Comparative Example 6 | Sn | 0.5 | 230 | 5.2 | 145.8 | — | — |
| Comparative Example 7 | Sn | 0.2 | 230 | 5.1 | 137.7 | — | — |
| Comparative Example 8 | Al | 34.3 | — | −0.08 | −1.04 | — | — |
| Comparative Example 9 | Ti | 23.2 | — | 0.24 | 0.35 | — | — |
| Comparative Example 10 | Zr | 26.1 | — | −0.01 | 0.35 | — | — |
| Reference Example 1 | Ge | 33.3 | — | 6.77 | 8.1 | — | — |

Next, plasma treatment was performed in the same manner as described above except that each of $Cl_2$/Ar gas was used instead of $CF_4$ gas as an etching gas and that each gas was introduced at 10 ml/min.

The plasma treatment time was 30 seconds when $CF_4$ gas was used, and 180 seconds when $Cl_2$/Ar gas was used.

As a control example, an $SiO_2$ film was formed to a thickness of 200 nm on a silicon substrate by a plasma CVD film forming method using tetraethoxysilane. The plasma treatment was then performed using $CF_4$ gas or $Cl_2$/Ar gas under the same conditions as Examples and Comparative Examples.

As the $SiO_2$ relative etching rate (no unit), the value obtained by dividing the etching rate (nm/s) of the metal-containing film produced by each of Examples or Comparative Examples by the etching rate (nm/s) of the $SiO_2$ film which is the control example (i.e., the etching rate of the metal-containing film/the etching rate of the $SiO_2$ film) is shown in Table 4.

Each of the metal-containing films formed in Examples 4 to 17 was solid at 400° C. under an atmosphere of 1 atm.

Furthermore, the composition B1 for forming a metal-containing film used in each of Examples 5 and 8, the composition B2 for forming a metal-containing film used in each of Examples 6 and 9, and the composition B3 for forming a metal-containing film used in Example 7 had an onset temperature for curing of 200° C. or lower.

Each of the compositions B4 to B11 for forming metal-containing films used in Examples 10 to 17 had an onset temperature for curing of 200° C. or lower.

The solid state of the film as described above and the onset temperature for curing were determined by the method described above.

In Table 4, an example in which the $SiO_2$ relative etching rate was a negative value means that a substance was adversely attached and the thickness was increased in the plasma treatment. In other words, the film was not etched.

From the results shown in Table 4, as a result, in each of Examples 4 to 17 in which the content of tin was 1 atm % or more, the SiO$_2$ relative etching rate with respect to CF$_4$ gas was 1 or less, while the SiO$_2$ relative etching rate with respect to Cl$_2$/Ar gas exceeded 1, suggesting that the film had switching characteristics.

In Example 5 and 11 to 14, the SiN$_x$ relative etching rate with respect to CF$_4$ gas was 1 or less, while the SiN$_x$ relative etching rate with respect to Cl$_2$/Ar gas exceeds 1, suggesting that the film had switching characteristics.

In Comparative Examples 5 to 7 (Sn content<1 atm %)), the SiO$_2$ relative etching rate exceeded 1 whether Cl$_2$/Ar gas or CF$_4$ gas was used, suggesting that the film did not have switching characteristics.

In Comparative Examples 8 to 10, the SiO$_2$ relative etching rate was 1 or less whether Cl$_2$/Ar gas or CF$_4$ gas was used, suggesting that the film did not have switching characteristics.

(Evaluation of Trench Filling Properties (Evaluation of Embedding Properties))

A metal-containing film was produced in the same manner as in Examples 1 to 3, 7, and 11 to 14, or Comparative Example 1 except that a silicon oxide substrate provided with a trench pattern having a width of 100 nm and a depth of 200 nm was used as a substrate instead of the silicon substrate.

The trenches filled with the metal-containing film were observed by a cross-sectional SEM. The case where the filled area was 50% or more of the area in the trenches was designated as A (favorable filling properties), and the case where the filled area was less than 50% of the area in the trenches was designated as B (poor filling properties).

The evaluation results are shown in Table 5.

TABLE 5

|  | 100 nm width trench |
|---|---|
| Example 1 | A |
| Example 2 | A |
| Example 3 | A |
| Example 7 | A |
| Example 11 | A |
| Example 12 | A |
| Example 13 | A |
| Example 14 | A |
| Comparative Example 1 | A |

As shown in Table 5, in each of Examples 1 to 3, 7, and 11 to 14 had favorable trench filling properties (embedding properties).

The disclosures of Japanese Application 2017-221919 filed on Nov. 17, 2017 and Japanese Application 2018-60575 filed on Mar. 27, 2018 are incorporated herein by reference in their entirety.

All publications, patent applications, and technical standards mentioned in this specification are incorporated herein by reference to the same extent as if each individual publication, patent application, or technical standard was specifically and individually indicated to be incorporated by reference.

The invention claimed is:

1. A semiconductor element intermediate comprising:
a substrate; and
a multilayer resist layer,
wherein the multilayer resist layer comprises a metal-containing film, and
the metal-containing film has a content of germanium element of 20 atm % or more, or a total content of tin element, indium element, and gallium element of 1 atm % or more, as measured by X-ray photoelectric spectroscopy,
wherein a recess is formed in at least one layer of the multilayer resist layer, and
the metal-containing film is formed inside the recess and is in contact with a bottom of the recess.

2. The semiconductor element intermediate according to claim 1, wherein the metal-containing film is solid at 400° C. under an atmosphere of 1 atm.

3. The semiconductor element intermediate according to claim 1, wherein the metal-containing film has a content of germanium element of 30 atm % or more, or a total content of tin element, indium element, and gallium element of from 2 atm % to 30 atm %.

4. The semiconductor element intermediate according to claim 1, wherein the metal-containing film comprises a germanium oxide, or comprises at least one selected from a tin oxide, an indium oxide, or a gallium oxide.

5. The semiconductor element intermediate according to claim 1, wherein the metal-containing film is at least one layer included in the multilayer resist layer.

6. The semiconductor element intermediate according to claim 1,
wherein the multilayer resist layer comprises at least one of a spin-on carbon film or an amorphous silicon film, and
the metal-containing film has a content of germanium element of 20 atm % or more as measured by X-ray photoelectric spectroscopy.

7. The semiconductor element intermediate according to claim 1,
wherein the multilayer resist layer comprises at least one of a silicon dioxide film or a silicon nitride film, and
the metal-containing film has a total content of tin element, indium element, and gallium element of 1 atm % or more, as measured by X-ray photoelectric spectroscopy.

8. The semiconductor element intermediate according to claim 1, wherein the metal-containing film is a resist film.

9. The semiconductor element intermediate according to claim 1, wherein the metal-containing film is an embedded insulating film.

10. The semiconductor element intermediate according to claim 9,
wherein
the recess has a width of from 5 nm to 300 nm.

11. A composition for forming a metal-containing film in a semiconductor element intermediate,
wherein the composition has a content of germanium element of 20 atm % or more and less than 100 atm %, or a total content of tin element, indium element, and gallium element of 1 atm % or more and 30 atm % or less, as measured by X-ray photoelectric spectroscopy after firing at 400° C. for 10 minutes under a nitrogen atmosphere.

12. The composition for forming a metal-containing film according to claim 11, wherein the composition has a refractive index of from 1.3 to 2.0, after firing at 400° C. for 10 minutes under a nitrogen atmosphere.

13. The composition for forming a metal-containing film according to claim 11, wherein the metal-containing film has a content of germanium element of 30 atm % or more, or a total content of tin element, indium element, and gallium element of from 2 atm % to 30 atm %.

14. The composition for forming a metal-containing film according to claim 11, wherein the composition has an onset temperature for curing of 300° C. or lower.

15. The composition for forming a metal-containing film according to claim 11,
wherein the composition comprises at least one selected from the group consisting of a germanium alkoxide compound, a germanium carbide compound, a germanium hydroxide, and a germanium halide, or comprises at least one selected from the group consisting of a tin alkoxide compound, a tin carbide compound, a tin hydroxide, a tin halide, an indium alkoxide compound, an indium carbide compound, an indium hydroxide, an indium halide, a gallium alkoxide compound, a gallium carbide compound, a gallium hydroxide, and a gallium halide.

16. The composition for forming a metal-containing film according to claim 11, wherein the composition comprises a solvent.

17. A method of producing the semiconductor element intermediate according to claim 1, wherein the method comprises steps of:
preparing a member for forming a metal-containing film; and
forming a multilayer resist layer;
forming a recess in at least one layer of the multilayer resist layer; and
forming a metal-containing film inside the recess and in contact with a bottom of the recess on the member for forming a metal-containing film by a sputtering method.

18. A method of producing a semiconductor element intermediate, wherein the method comprises steps of:
preparing a member for forming a metal-containing film;
applying the composition for forming a metal-containing film according to claim 11, onto the member for forming a metal-containing film; and
firing the applied composition for forming a metal-containing film.

19. A method of producing a semiconductor element, comprising steps of:
preparing the semiconductor element intermediate according to claim 1; and
etching the semiconductor element intermediate.

20. A method of producing a semiconductor device, comprising steps of:
preparing a member comprising a resist layer comprising an upper layer and a lower layer and exposing and etching the upper layer;
etching the lower layer;
forming a metal-containing film in a recess formed in the lower layer;
exposing and etching the upper layer again; and
etching the lower layer again,
wherein the metal-containing film has a content of germanium element of 20 atm % or more, or a total content of tin element, indium element, and gallium element of 1 atm % or more, as measured by X-ray photoelectric spectroscopy.

21. A method of producing a semiconductor element, comprising steps of:
forming a resist layer A on a substrate;
forming a metal-containing film on the resist layer A;
further forming a resist layer B different from the resist layer A on the metal-containing film;
exposing and developing the resist layer B;
etching the metal-containing film;
etching the resist layer A; and
removing the metal-containing film with an etching gas,
wherein the metal-containing film has a content of germanium element of 20 atm % or more and less than 100 atm %, or a total content of tin element, indium element, and gallium element of 1 atm % or more and 30 atm % or less, as measured by X-ray photoelectric spectroscopy.

* * * * *